(12) United States Patent
Kang

(10) Patent No.: US 6,778,423 B2
(45) Date of Patent: Aug. 17, 2004

(54) NONVOLATILE FERROELECTRIC MEMORY DEVICE

(75) Inventor: Hee Bok Kang, Daejeon (KR)

(73) Assignee: Hynix Semiconductor, Inc., Ichon-shi (KR)

(*) Notice: Subject to any disclaimer, the term of this patent is extended or adjusted under 35 U.S.C. 154(b) by 30 days.

(21) Appl. No.: 10/331,586

(22) Filed: Dec. 31, 2002

(65) Prior Publication Data
US 2004/0047193 A1 Mar. 11, 2004

(30) Foreign Application Priority Data
Sep. 6, 2002 (KR) ................................. 10-2002-0053727

(51) Int. Cl.⁷ .............................................. G11C 11/22
(52) U.S. Cl. ..................................... 365/145; 365/233.5
(58) Field of Search ............................... 365/145, 233.5

(56) References Cited

U.S. PATENT DOCUMENTS 6,091,622 A    7/2000  Kang
6,385,078 B2   5/2002  Jeon
6,661,698 B1 * 12/2003  Kang ........................ 365/145

FOREIGN PATENT DOCUMENTS

JP    10-11976   1/1998   .......... G11C/14/00
JP    10-69790   3/1998   .......... G11C/14/00

* cited by examiner

Primary Examiner—M. Tran
(74) Attorney, Agent, or Firm—Jacobson Holman PLLC

(57) ABSTRACT

The disclosed nonvolatile ferroelectric memory device is configured to reduce the frequency of whole chip operation by performing a cell operation at transition points of a reset signal and a write enable signal instead of performing the cell operation at a transition point of a chip enable signal. As a result, data latched in a sense amplifier can be outputted without performing the whole chip operation, thereby improving reliability of the cell and reducing power consumption.

18 Claims, 21 Drawing Sheets

NONVOLATILE FERROELECTRIC MEMORY DEVICE

BACKGROUND OF THE INVENTION

1. Field of the Invention

The present invention generally relates to nonvolatile ferroelectric memory devices, and more specifically, to a nonvolatile ferroelectric memory device configured to reduce the frequency of whole chip operation by performing a cell operation at transition points of a reset signal and a write enable signal instead of performing the cell operation at a transition point of a chip enable signal. As a result, data latched in a sense amplifier can be outputted without performing the whole chip operation, thereby improving reliability of the cell and reducing power consumption.

2. Description of the Prior Art

Generally, a ferroelectric randaom access memory (hereinafter, referred to as 'FRAM') has attracted considerable attention as a next generation memory device because it has a data processing speed as fast as a DRAM and conserves data even after the power is turned off.

The FRAM includes capacitors similar to the DRAM, but the capacitors have a ferroelectric substance for utilizing the characteristic of a high residual polarization of the ferroelectric substance in which data is removed low even after eliminating an electric field applied thereto.

FIG. 1 is a characteristic curve illustrating a hysteresis loop of a general ferroelectric substance.

As shown in FIG. 1, a polarization induced by an electric field does not vanish but keeps some strength ('d' or 'a' state) even after the electric field is cleared due to existence of a residual (or spontaneous) polarization.

These 'd' and 'a' states may be assigned to binary values of '1' and '0' for use as a memory cell.

FIG. 2 is a structural diagram illustrating a unit cell of the FRAM device.

As shown in FIG. 2, the unit cell of the conventional FRAM is provided with a bitline BL arranged in one direction and a wordline WL arranged in another direction vertical to the bitline BL. A plateline PL is arranged parallel to the wordline and spaced at a predetermined interval. The unit cell is also provided with a transistor T1 having a gate connected to an adjacent wordline WL and a source connected to an adjacent bitline BL, and a ferroelectric capacitor FC1 having the first terminal of the two terminals connected to the drain terminal of the transistor T1 and the second terminal of the two terminals connected to the plateline PL.

The data input/output operation of the conventional FRAM is as follows.

FIG. 3a is a timing diagram illustrating a write mode of the conventional FRAM.

Referring to FIG. 3a, when a chip enable signal CEB applied externally is enabled from a high to low level, an inputted address is decoded and its corresponding wordline WL is enabled. In other words, a potential of the wordline WL transits from a low to high level, thereby selecting the cell.

In this way, while the wordline is held at a high level, a high level signal of a predetermined interval and a low level signal of a predetermined interval are sequentially applied to its corresponding plate line PL.

In order to write a binary logic value "1" in the selected cell, data signals DIN of high level and low level are inputted to its corresponding bitline BL.

In other words, in an interval where high level signals are applied to a bitline BL, if a low level signal is applied to a plateline PL, a logic value of "1" is written in the ferroelectric capacitor FC1.

If a low level signal is applied to a bitline BL and a high level signal is applied to a plateline PL, a logic value of "0" is written in the ferroelectric capacitor FC1.

FIG. 3b is a timing diagram illustrating a read mode of the conventional FRAM.

Referring to FIG. 3b, when a chip enable signal CEB externally transits from a "high" to "low" level, all bitlines are equalized to a "low" level by an equalization signal before selection of a required wordline.

After each bitline BL is activated, an address is decoded and the required wordline WL is enabled by the decoded address, that is, the required wordline WL transits from a "low" to "high" level, thereby selecting a corresponding unit cell.

A high level signal is applied to a plateline of the selected cell to destroy a data corresponding to the logic value "1" stored in the FRAM.

If the logic value "0" is stored in the FRAM, a corresponding data will not be destroyed.

The destroyed and non-destroyed data output different values, respectively, according to the above-described hysteresis loop characteristics.

As shown in the hysteresis loop of FIG. 1, the state moves from 'd' to 'f' when the data is destroyed while the state moves from 'a' to 'f' when the data is not destroyed.

After the lapse of a predetermined time, if a sense amplifier enable signal SEN is activated and a sense amplifier is enabled, the destroyed data amplified by the enabled sense amplifier outputs a logic value "0".

After the sense amplifier amplifies the data, the data should be recovered into the original data. Accordingly, when a 'high' signal is applied to the required wordline WL, the plateline PL is disabled from "high" to "low".

FIG. 4 is a block diagram illustrating a chip control signal generating circuit for generating a chip control signal in a conventional nonvolatile ferroelectric memory device.

A chip enable signal buffer 1 receives a signal CEBPAD inputted in a chip enable pad and then outputs a chip enable signal CEB.

An address buffer 2 receives an address ADDPAD<m:0> inputted in an address pad and then outputs an address ADD<m:0>.

A chip enable signal transition detector 3 receives the chip enable signal CEB, detects a transition point of the chip enable signal CEB, and then outputs a chip enable signal transition detecting signal CTD.

An address transition detector 4 receives the address ADD<m:0>, detects a transition point of the address ADD<m:0>, and then outputs an address transition detecting signal ATD.

A synthesizer 5 synthesizes the chip enable signal transition detecting signal CTD and the address transition detecting signal ATD, and then outputs a synthesized transition detecting signal TDS.

A chip control signal generator 6 outputs chip control signals by using the transition detecting signal TDS synthesized in response to the chip enable signal CEB.

Here, the address ADD<m:0> outputted from the address buffer 2 is decoded by a decoder to select a wordline or a bitline.

As described above, according to the conventional ferroelectric memory device, the whole chip operates whenever the chip enable signal CEB transits from a high to low level. Here, when data stored in the ferroelectric capacitor is read, the capacitor operates as a destructive mode, thereby causing the fatigue phenomenon of ferroelectric material. After the data stored in the capacitor is read, the original data should be re-written. As a result, the control becomes complicated, the access time becomes delayed and current consumption increases.

SUMMARY OF THE INVENTION

Accordingly, it is an object of the present invention to provide a nonvolatile ferroelectric memory device configured to reduce the frequency of whole chip operation by performing a cell operation at transition points of a reset signal and a write enable signal instead of performing the cell operation at a transition point of a chip enable signal, thereby improving reliability of the cell and reducing power consumption.

The disclosed nonvolatile ferroelectric memory device comprising a cell array including a plurality of ferroelectric memory cells for storing data through a bitline and reading the stored data, selected by a wordline and a plateline includes: an address latch for receiving an inputted address through an address pad to select the wordline and the bitline before the cell operation, and for latching the address during the cell operation; a reset signal transition detecting means for detecting a start point where a reset operation and a cell operation are both performed, and for outputting a reset signal transition detecting signal; a write enable signal transition detecting means for detecting a point where a write operation starts and for outputting a write enable signal transition detecting signal; a synthesizing means for synthesizing an address transition detecting signal detecting a transition point of an address selectively latched by the address latch, the reset signal transition detecting signal and the write enable signal transition detecting signal, and for outputting a transition synthesizing signal; and a chip control signal generating means for generating chip control signals in response to the transition synthesizing signal.

BRIEF DESCRIPTION OF THE DRAWINGS

The present invention will be described in terms of several embodiments to illustrate its broad teachings. Reference is also made to the attached drawings.

DETAILED DESCRIPTION OF THE PREFERRED EMBODIMENTS

The present invention will be described in detail with reference to the accompanying drawings.

Figure 1:
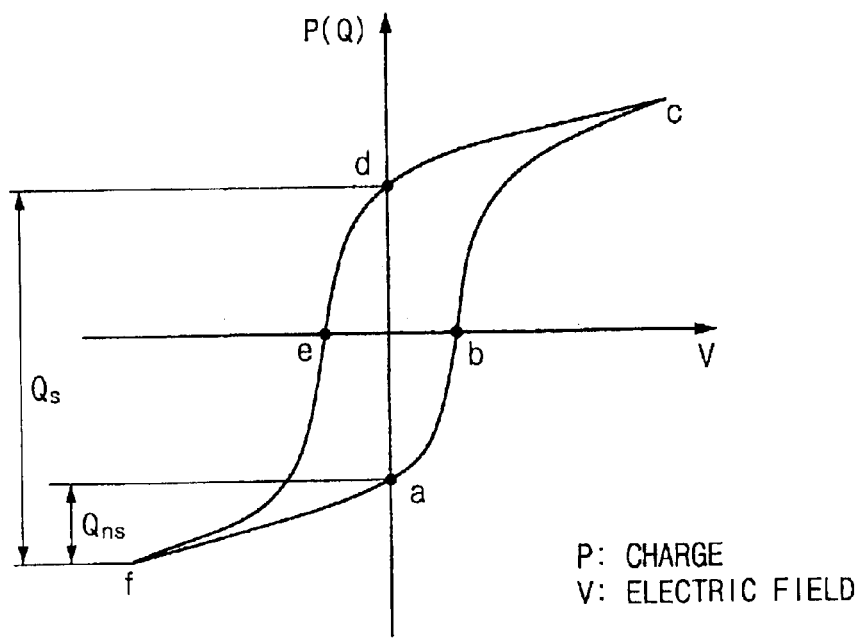
FIG. 1 is a characteristic curve illustrating a hysteresis loop of a general ferroelectric substance.
Figure 2:
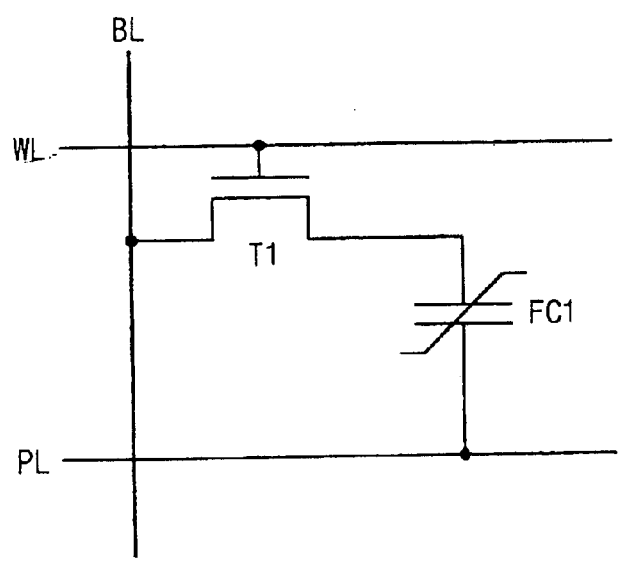
FIG. 2 is a structural diagram illustrating a FRAM cell device.
Figure 3A:
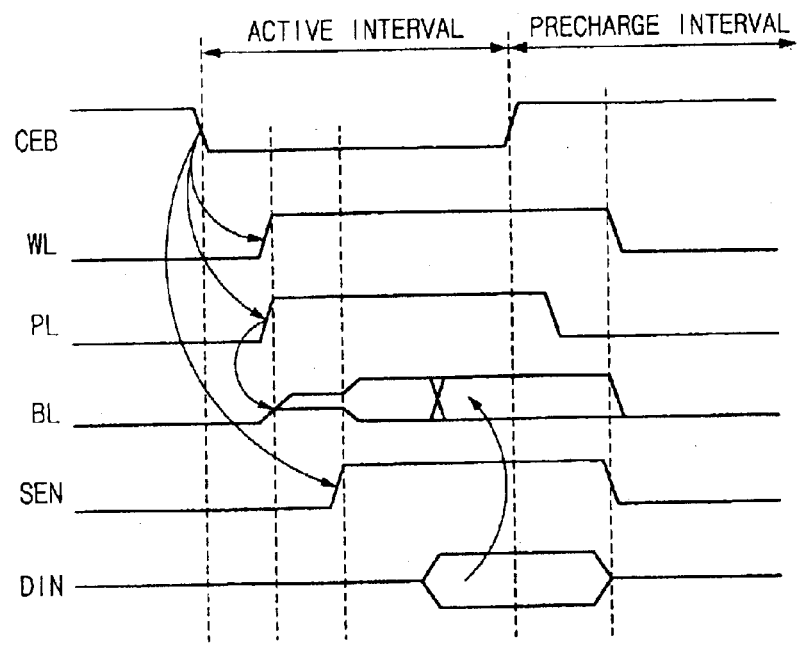
FIGS. 3a and 3b are timing diagrams illustrating read/write operations of a conventional ferroelectric memory device.
Figure 3B:
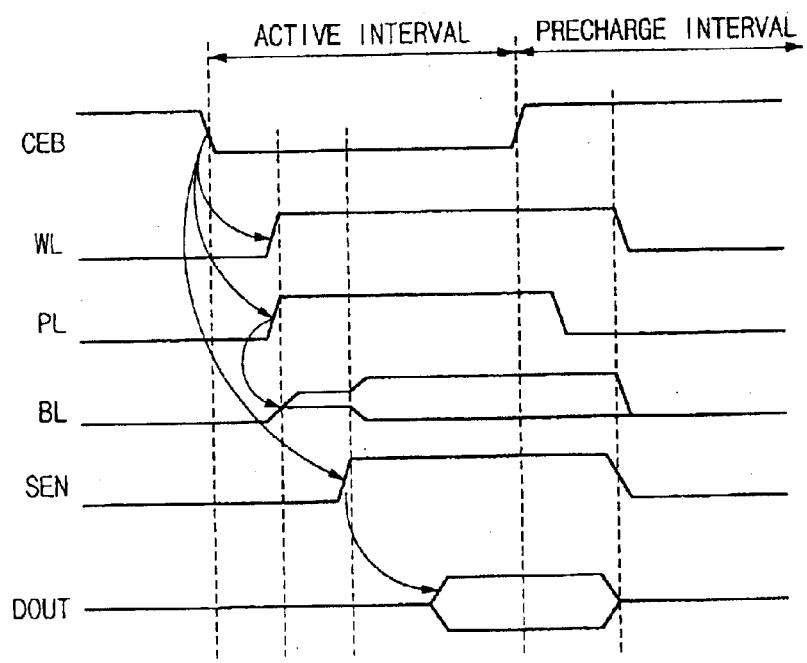
Figure 4:
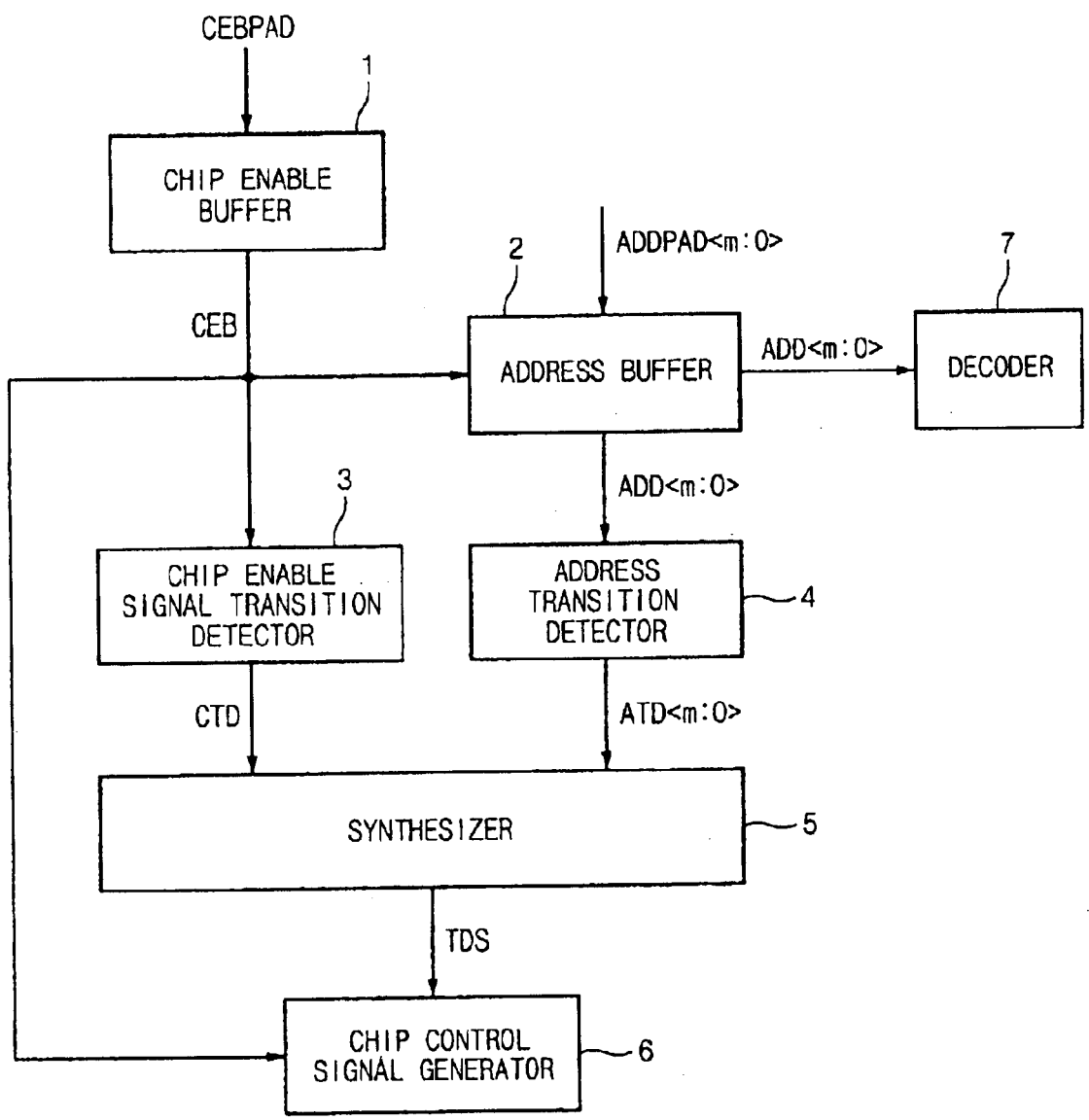
FIG. 4 is a block diagram illustrating a chip control signal generating circuit in a conventional nonvolatile ferroelectric memory device.
Figure 5:
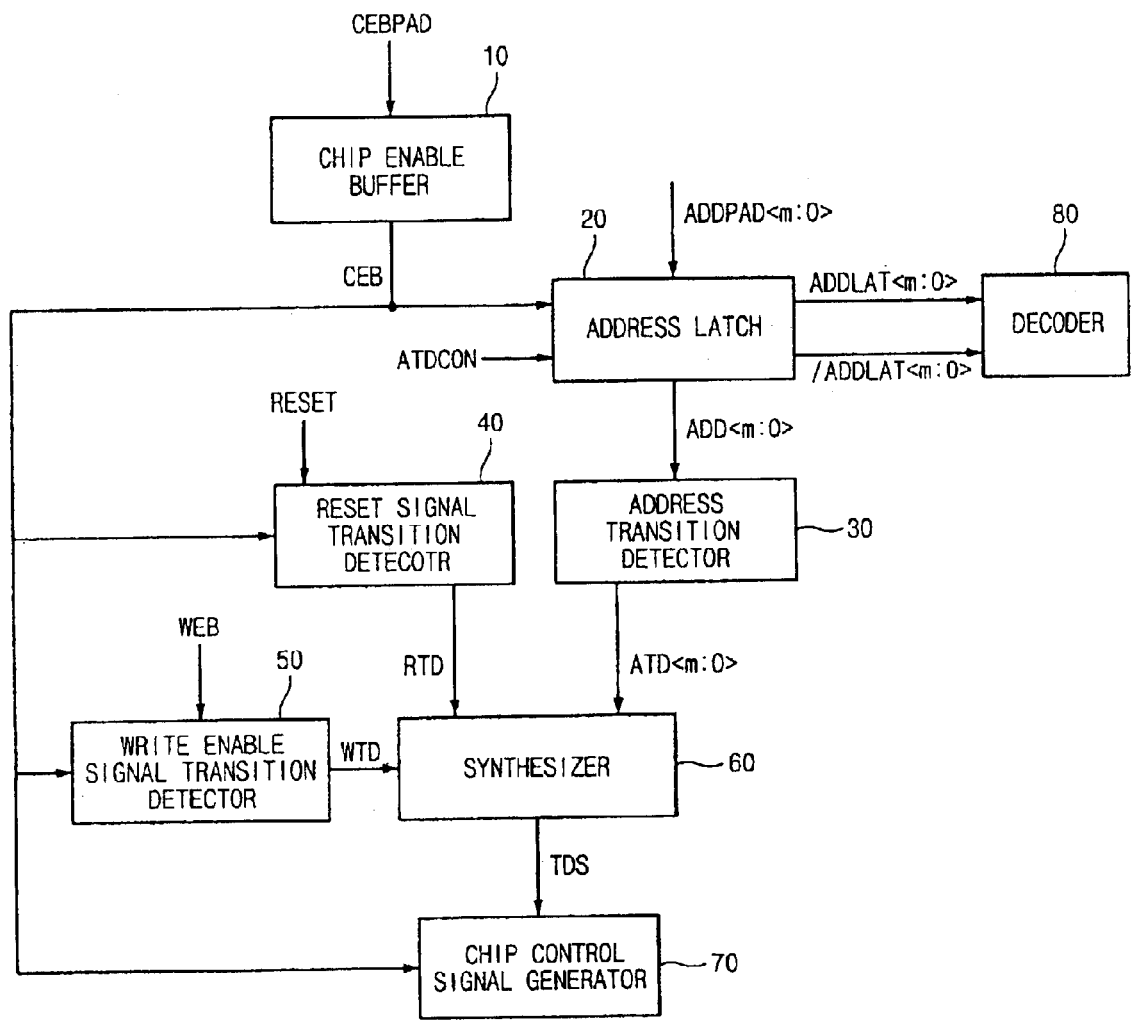
FIG. 5 is a block diagram illustrating a chip control signal generating circuit in a nonvolatile ferroelectric memory device according to the present invention.

FIG. 5 is a block diagram illustrating a chip control signal generating circuit in a nonvolatile ferroelectric memory device according to the present invention.

A chip enable signal buffer 10 receives a signal CEBPAD inputted to a chip enable pad, and an address latch 20 receives an address ADDPAD inputted to an address pad.

An address transition detector 30 receives an address ADD<m:0> outputted from the address latch 20, detects a transition point of the address ADD<m:0>, and then outputs an address transition detecting signal ATD.

A reset signal transition detector 40 detects a point where both a reset signal RESET and a chip enable signal CEB outputted from the chip enable buffer 10 transit to a low level, and then outputs a reset signal transition detecting signal RTD.

A write enable signal transition detector 50 detects a transition point of a write enable signal WEB, and then outputs a write enable signal transition detecting signal WTD.

A synthesizer 60 synthesizes the reset signal transition detecting signal RTD, the write enable signal transition detecting signal WTD and the address transition detecting signal ATD, and then outputs a synthesized transition detecting signal TDS.

A chip control signal generator 70 outputs chip control signals for controlling the operation of the chip in response to the transition detecting signal TDS.

Here, an address ADDLAT<m:0> outputted from the address buffer is decoded by a decoder 80 to select a wordline or a column.

Figure 6:
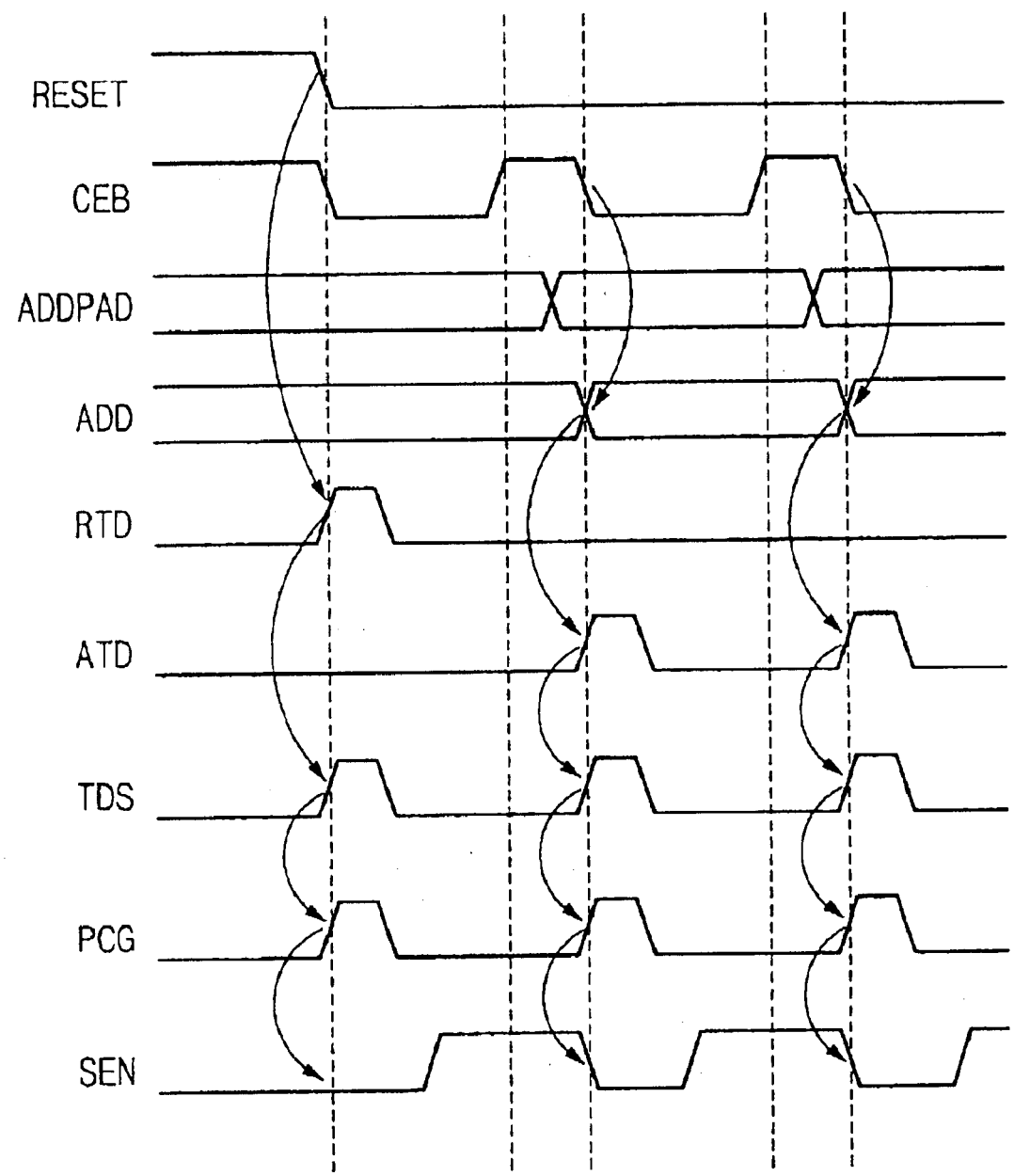
FIG. 6 is a timing diagram illustrating the operation of the nonvolatile ferroelectric memory device of FIG. 5.

FIG. 6 is a timing diagram illustrating the operation of the nonvolatile ferroelectric memory device of FIG. 5 when the chip enable signal CEB transits to a low level and then the reset signal RESET transits to a low level to generate a reset signal transition detecting signal RTD.

After power-on, a reset signal transition detecting signal RESET is generated by combining the reset signal RESET and the chip enable signal CEB in a chip operation of a first address. In other words, while the chip enable signal CEB is held at a low level, the reset signal transition detecting signal RTD is generated as a pulse type as the reset signal RESET transits from a high to low level.

Additionally, after the reset signal RESET transits to a low level and the chip enable signal CEB transits from a high to a low level, the reset signal transition detecting signal RTD is generated as a pulse.

In other words, when both the reset signal RESET and the chip enable signal CEB are at a low level, the reset signal transition detecting signal RTD is generated as a pulse.

Here, a generation point of the reset signal transition detecting signal RTD is regulated by using the chip enable signal CEB or the reset signal RESET according to the processing method of the chip enable signal.

After the chip operation of the second address, while the reset signal RESET is held at a low level, the reset signal transition detecting signal RTD is not generated although the chip enable signal CEB transits from a high to low level.

Additionally, because the address latch unit 20 is operated by the chip enable signal CEB, although an address is previously transited, the transited address signal is transmitted when the chip enable signal CEB transits from a high to low level.

As a result, the address transited by transition of the chip enable signal CEB is inputted into the address latch unit 20. The address transition detector 30 receives the address ADD from the address latch unit 20, and then generates the address transition detecting signal ATD detecting the address transition point.

Basically, the memory cell is operated by the address transition detecting signal ATD and the reset signal transition detecting signal RTD. If the address transition detecting signal ATD is not generated, the memory cell is not operated.

However, because another chip control operation receiving the chip enable signal CEB and the sense amplifier operation are continuously activated, data are normally read or written.

In a read operation, although the memory cell is not operated, the sense amplifier is continuously activated and a plurality of address data are maintained in the operation of previous address. As a result, the sense amplifier may immediately output data of the corresponding address via an output pad.

In a write operation, the write enable signal WEB transits from a high to low level to generate a write command. The write enable signal transition detector 50 detects a transition point of the write enable signal WEB and then outputs the write enable signal transition detecting signal WTD. The write operation is normally performed in the corresponding memory cell by the write enable signal transition detecting signal WTD.

In order to continuously store data of the previous address operation, the sense amplifier is constantly maintained at an active state before a new memory cell operation begins by the address transition. In other words, only when the address is transited and the address transition detecting signal ATD is generated, the sense amplifier is initialized and prepared for the next address operation.

Here, the active state of the sense amplifier is controlled by the sense amplifier enable signal SEN.

As a result, while the sense amplifier enable signal SEN is enabled to a high level, the sense amplifier may output data externally by using the output enable signal or the chip enable signal CEB.

Figure 7:
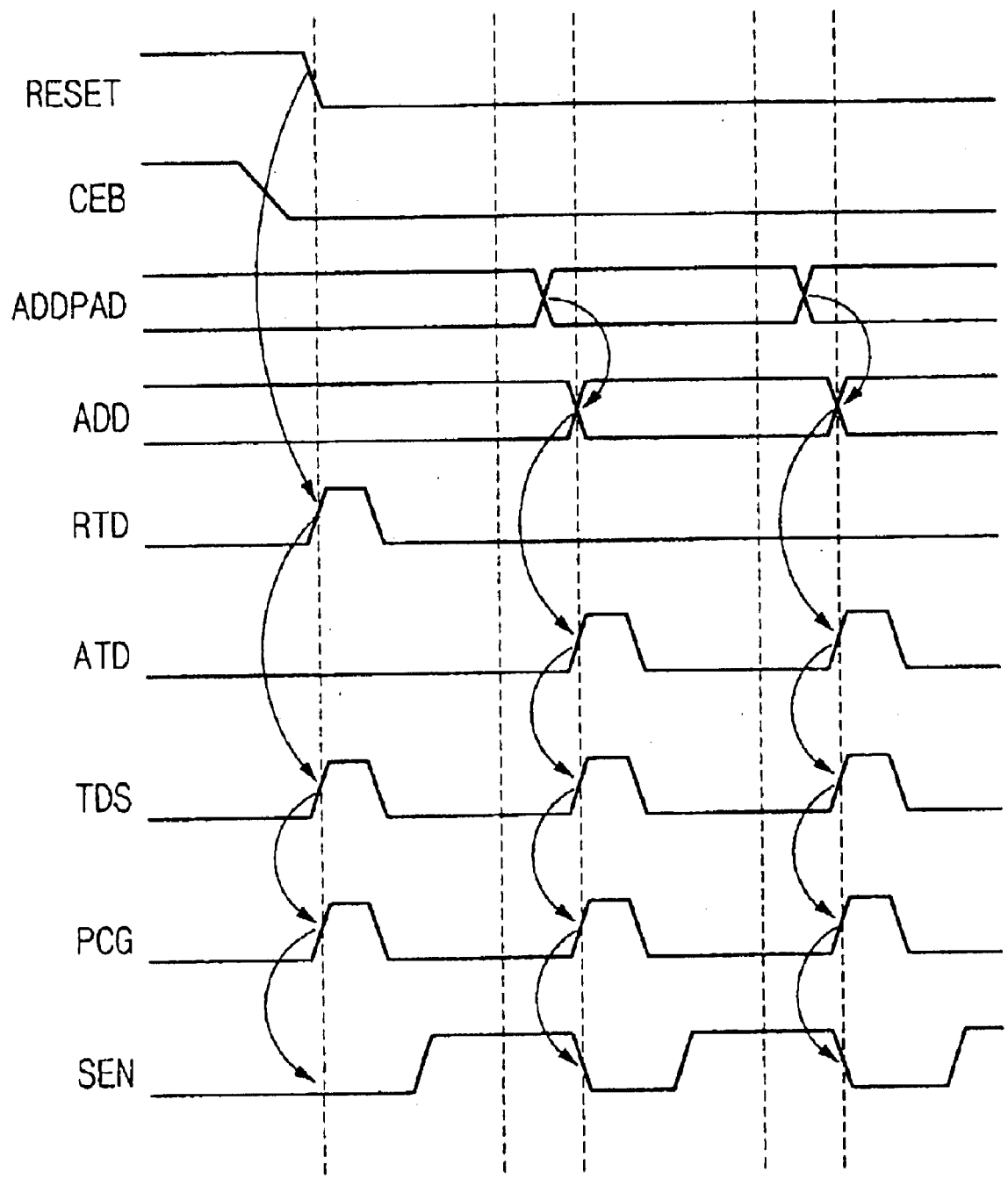
FIG. 7 is a timing diagram illustrating the operation of the nonvolatile ferroelectric memory device of FIG. 5 when a chip enable signal is held at a low level and an address transits.

FIG. 7 is a timing diagram illustrating the operation of the nonvolatile ferroelectric memory device of FIG. 5 when a chip enable signal is held at a low level and an address is transited.

Because the chip enable signal CEB is held at a low level, the address transition detecting signal ATD generated at a transition point of the address ADD and the initial reset signal transition detecting signal RTD are synchronized at the synthesized transition detecting signal TDS. As a result, chip control signals (for example, precharge signal PCG, sense amplifier enable signal SEN) are generated.

Figure 8:
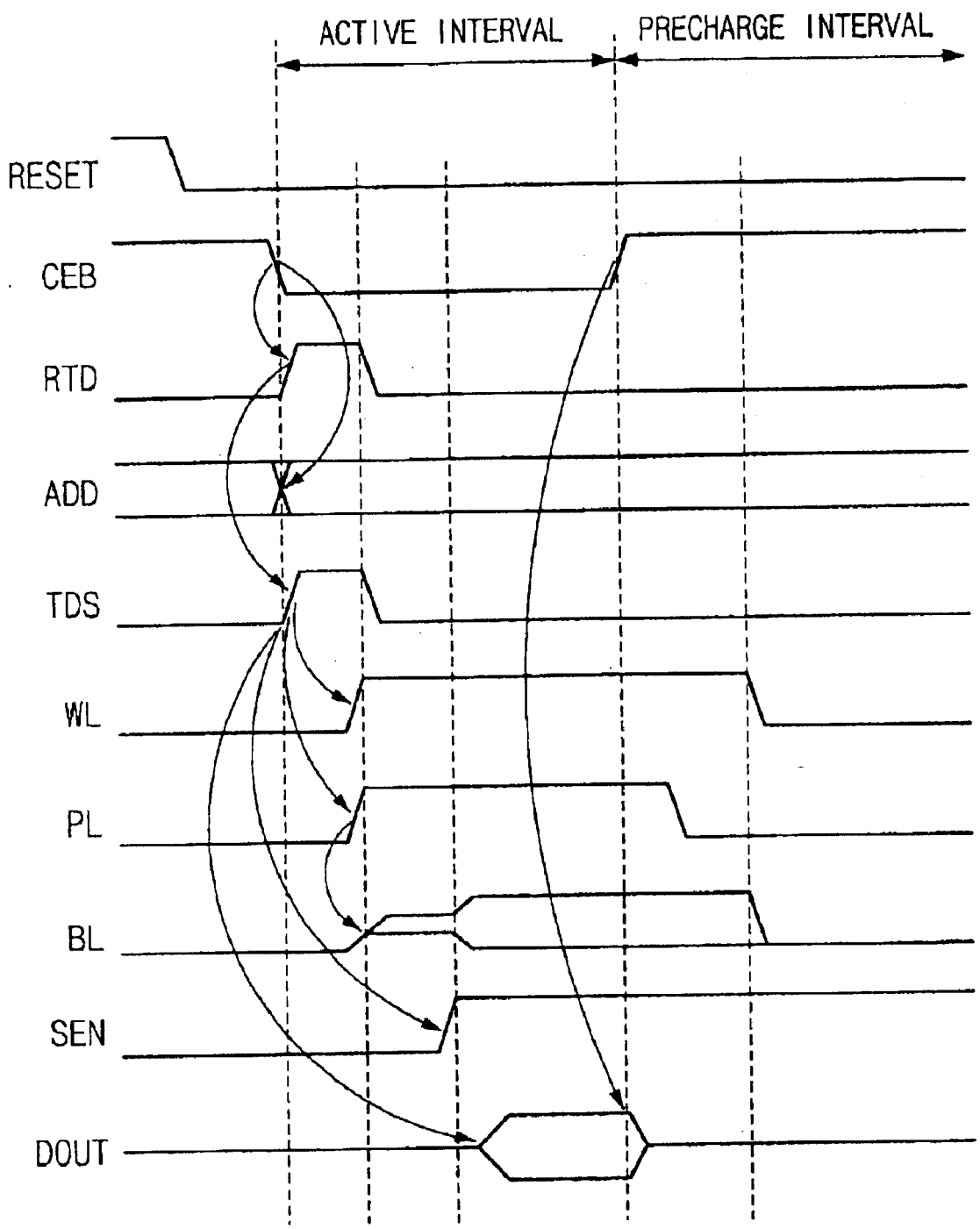
FIG. 8 is a timing diagram illustrating the operation of the nonvolatile ferroelectric memory device of FIG. 5 when a chip enable signal transits to a low level after a reset signal transits to a low level.

FIG. 8 is a timing diagram illustrating the operation of the nonvolatile ferroelectric memory device of FIG. 5 when a chip enable signal transits to a low level after a reset signal transits to a low level.

While the reset signal RESET transits to a low level and is held at a low level, if the chip enable signal CEB transits to a low level, the reset signal transition detecting signal RTD is generated at a point where the chip enable signal CEB transits to a low level.

As a result, the transition detecting signal TDS synthesized by the reset signal transition detecting signal RTD is generated to drive a wordline WL and a plateline PL. Here, because the address ADD is not changed, the address transition detecting signal ATD is not generated.

The sense amplifier enable signal SEN is continuously held at a high level even in a precharge interval where the chip enable signal CEB is at a high level to represent an active state.

Additionally, the output data DOUT is outputted in an interval where the chip enable signal CEB is at a low level, and precharged in an interval where the chip enable signal is at a high level.

Figure 9:
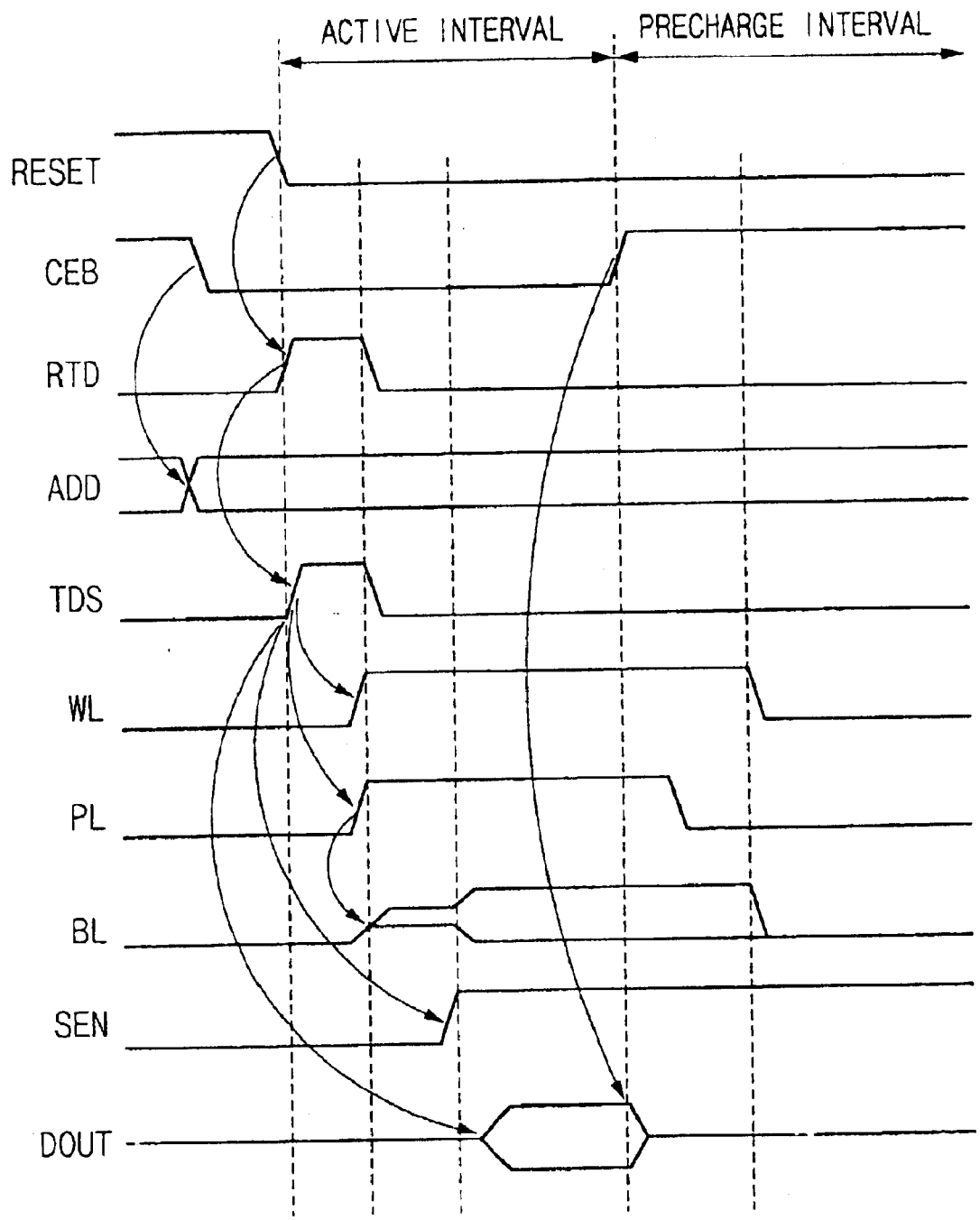
FIG. 9 is a timing diagram illustrating the operation of the nonvolatile ferroelectric memory device of FIG. 5 when a reset signal transits to a low level after a chip enable signal transits to a low level.

FIG. 9 is a timing diagram illustrating the operation of the nonvolatile ferroelectric memory device of FIG. 5 when a reset signal transits to a low level after a chip enable signal transits to a low level.

After the chip enable signal CEB transits to a low level, if the reset signal RESET transits to a low level, the reset signal transition detecting signal RTD is generated at a point where the reset signal RESET transits to a low level.

As a result, the transition detecting signal TDS synthesized by the reset signal transition detecting signal RTD is generated to drive a wordline WL and a plateline PL. Here, because the address ADD is not changed, the address transition detecting signal ATD is not generated.

The sense amplifier enable signal SEN is continuously held at a high level in a precharge interval where the chip enable signal CEB is at a high level to represent an active state.

Additionally, the output data DOUT is outputted in an interval where the chip enable signal CEB is at a low level and precharged in an interval where the chip enable signal CEB is at a high level.

Figure 10:
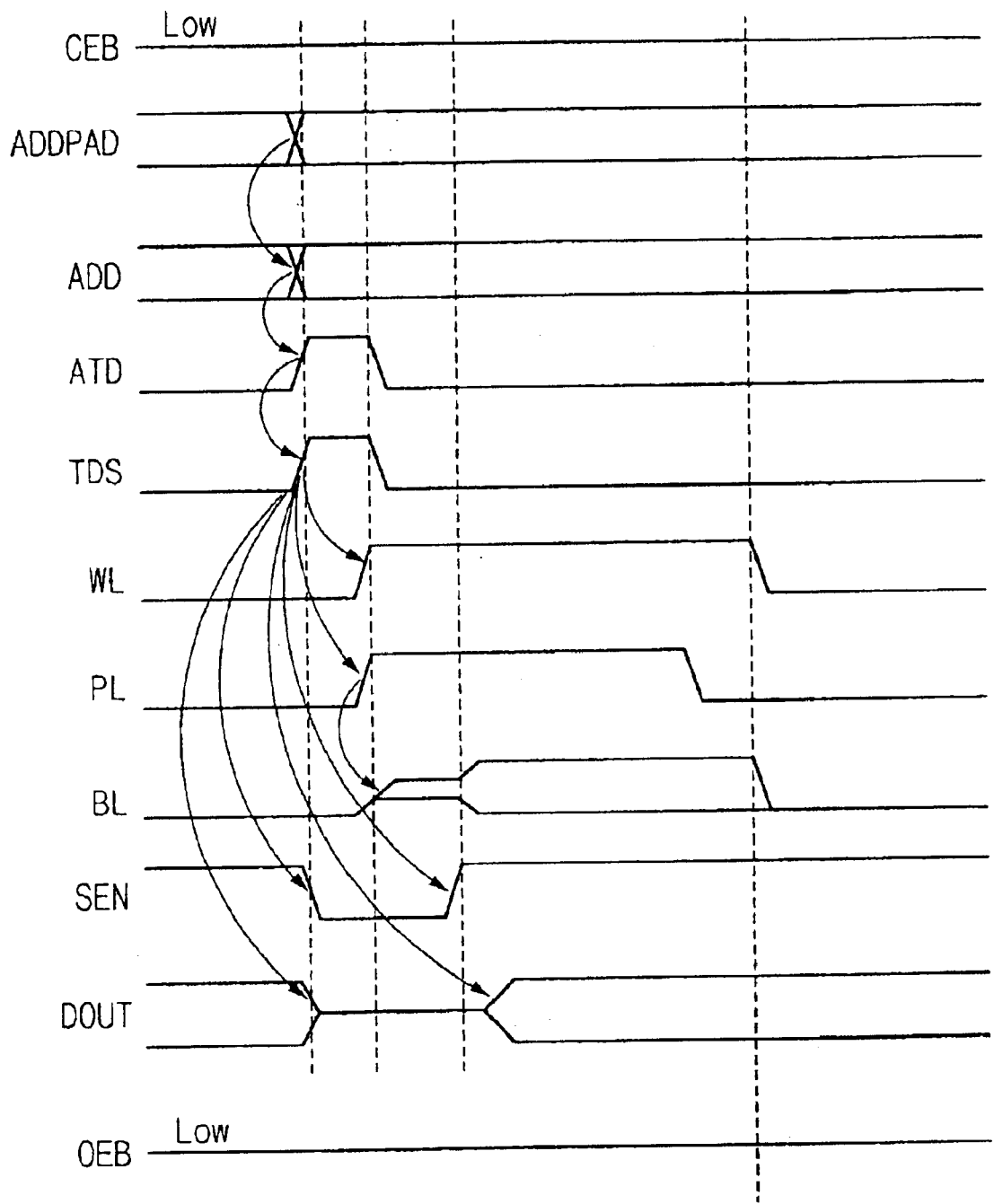
FIG. 10 is a timing diagram illustrating the operation of the nonvolatile ferroelectric memory device of FIG. 5 when a chip enable signal is held at a low level.

FIG. 10 is a timing diagram illustrating the operation of the nonvolatile ferroelectric memory device of FIG. 5 when both a chip enable signal and an output enable signal OEB are held at a low level.

When the chip enable signal CEB is held at a low level, if the next address ADDPAD is inputted, the address latch unit 20 latches the inputted address ADDPAD.

As a result, the address transition detector 30 generates the address transition detecting signal ATD. The synthesizer 50 generates the synthesized transition detecting signal TDS to drive a wordline WL and a plateline PL of the memory cell.

Figure 11:
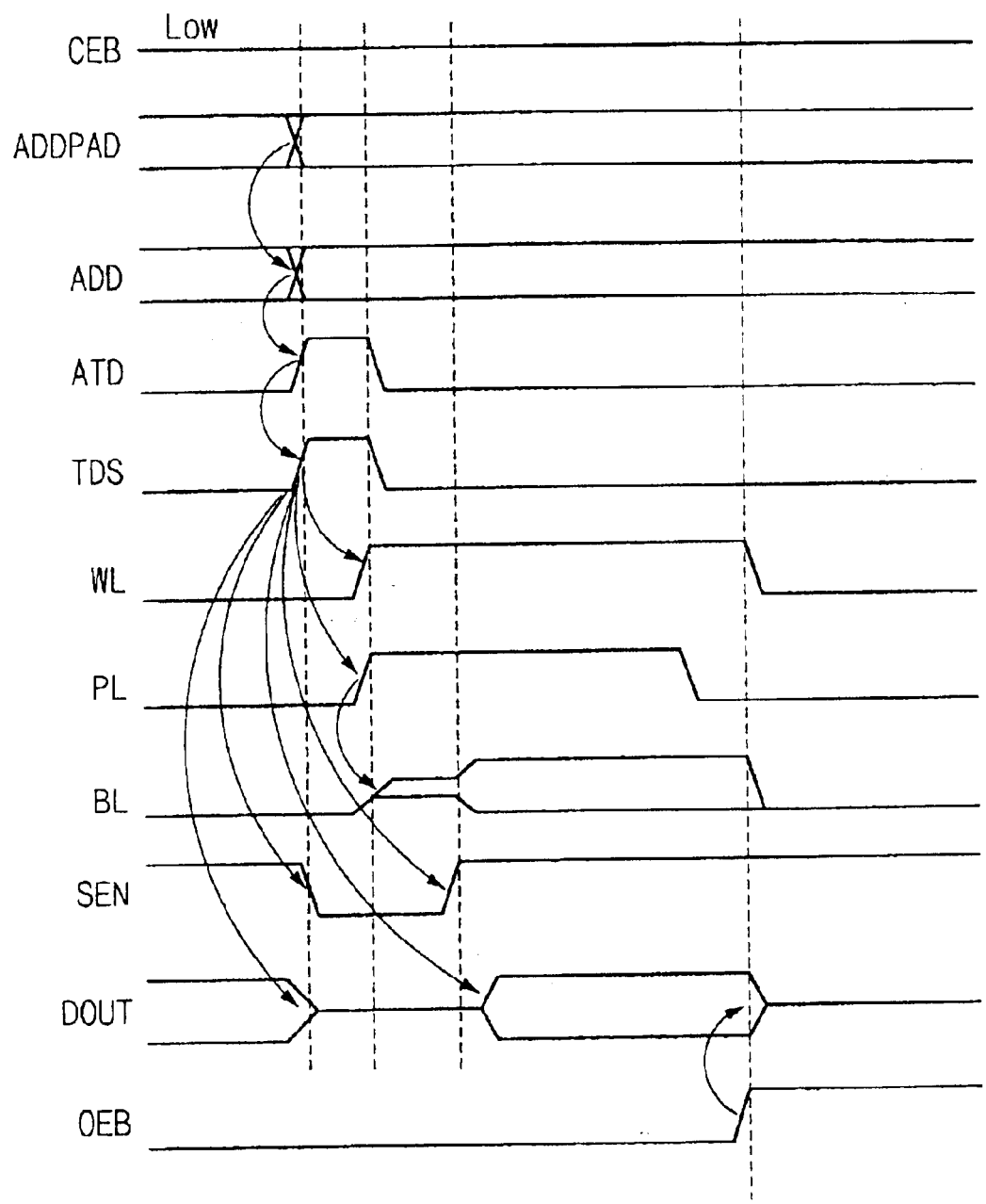
FIG. 11 is a timing diagram illustrating the operation of the nonvolatile ferroelectric memory device of FIG. 5 when an output enable signal OEB transits to a high level and then an output data DOUT is precharged.

FIG. 11 is a timing diagram illustrating the operation of the nonvolatile ferroelectric memory device of FIG. 5 when an output enable signal OEB transits to a high level and a chip enable signal CEB is maintained at a low level. Here, the output enable signal OEB transits to a high level and then output data DOUT is precharged.

When the chip enable signal CEB is held at a low level, if the next address ADDPAD is inputted, the address latch unit 20 latches the inputted address ADDPAD.

As a result, the address transition detector 30 generates the address transition detecting signal ATD. The synthesizer generates the synthesized transition detecting signal TDS to drive a wordline WL and a plateline PL of the memory cell.

Figure 12:
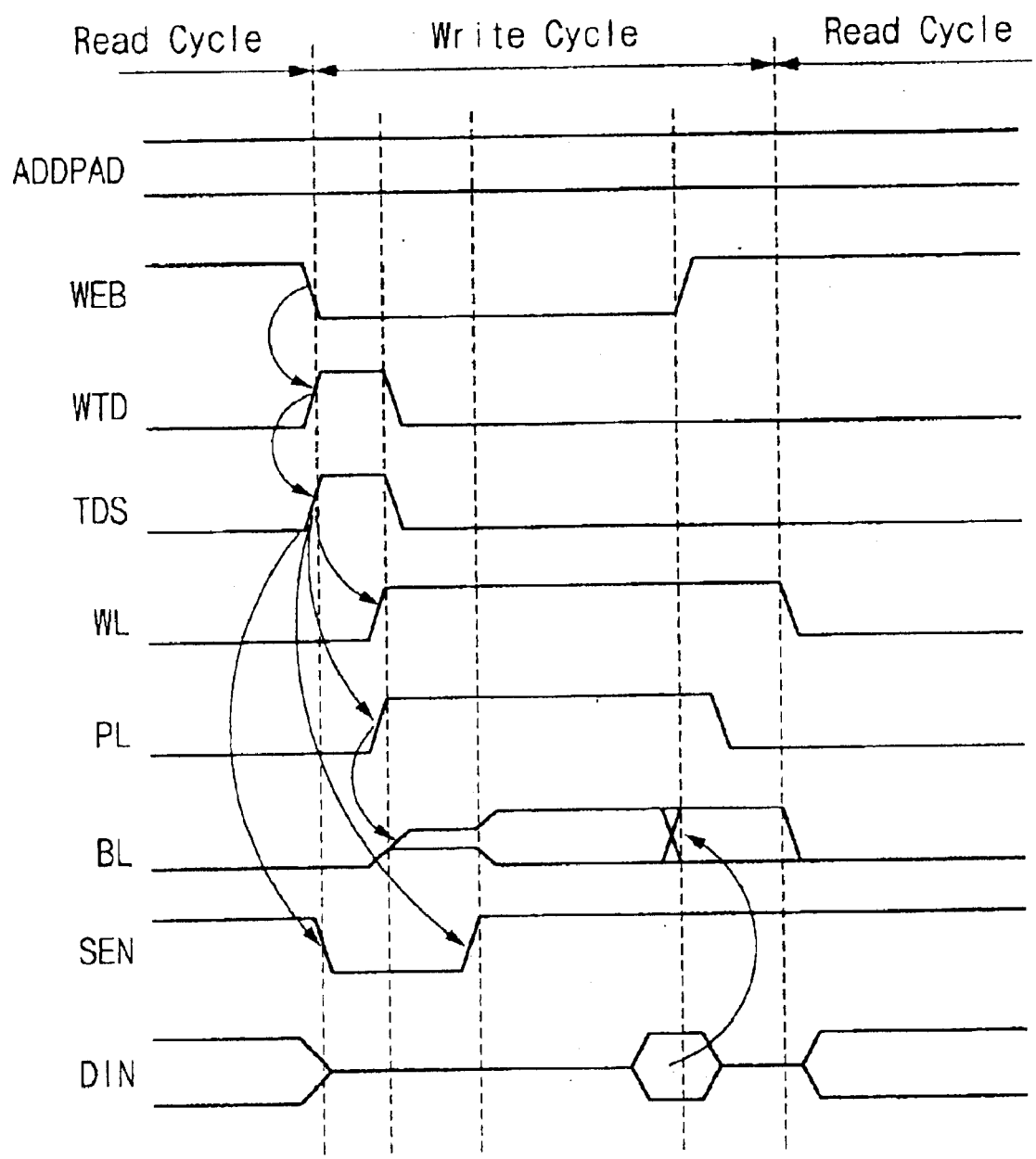
FIG. 12 is a timing diagram illustrating the operation of the nonvolatile ferroelectric memory device of FIG. 5 when a write enable signal transition detecting signal is generated.

FIG. 12 is a timing diagram illustrating the operation of the nonvolatile ferroelectric memory device of FIG. 5 when a write enable signal transition detecting signal is generated. If the write enable signal WEB transits from a high to low level to generate a write command, the write enable signal transition detector 50 detects a transition point of the write enable signal WEB to generate the transition detecting signal WTD. Here, we suppose that the address ADDPAD is not changed.

The synthesizer 60 generates the transition detecting signal synthesized by using the write enable signal transition detecting signal WTD. As a result, the write operation is normally performed to the corresponding memory cell.

In order to store data of the previous address, the sense amplifier is held at an active state before the write enable signal transition detecting signal WTD is generated before a write operation of the next memory cell is started. In other words, the sense amplifier is prepared for a write operation of the next memory cell only when the write enable signal WEB transits from a high to low level and the write enable signal transition detecting signal WTD is generated.

Then, the transition detecting signal TDS synthesized by the write enable signal transition detecting signal WTD is generated to drive a wordline WL and a plateline PL of the corresponding memory cell.

The input data DIN is data inputted to write next data in the corresponding memory cell in a write operation.

Figure 13:
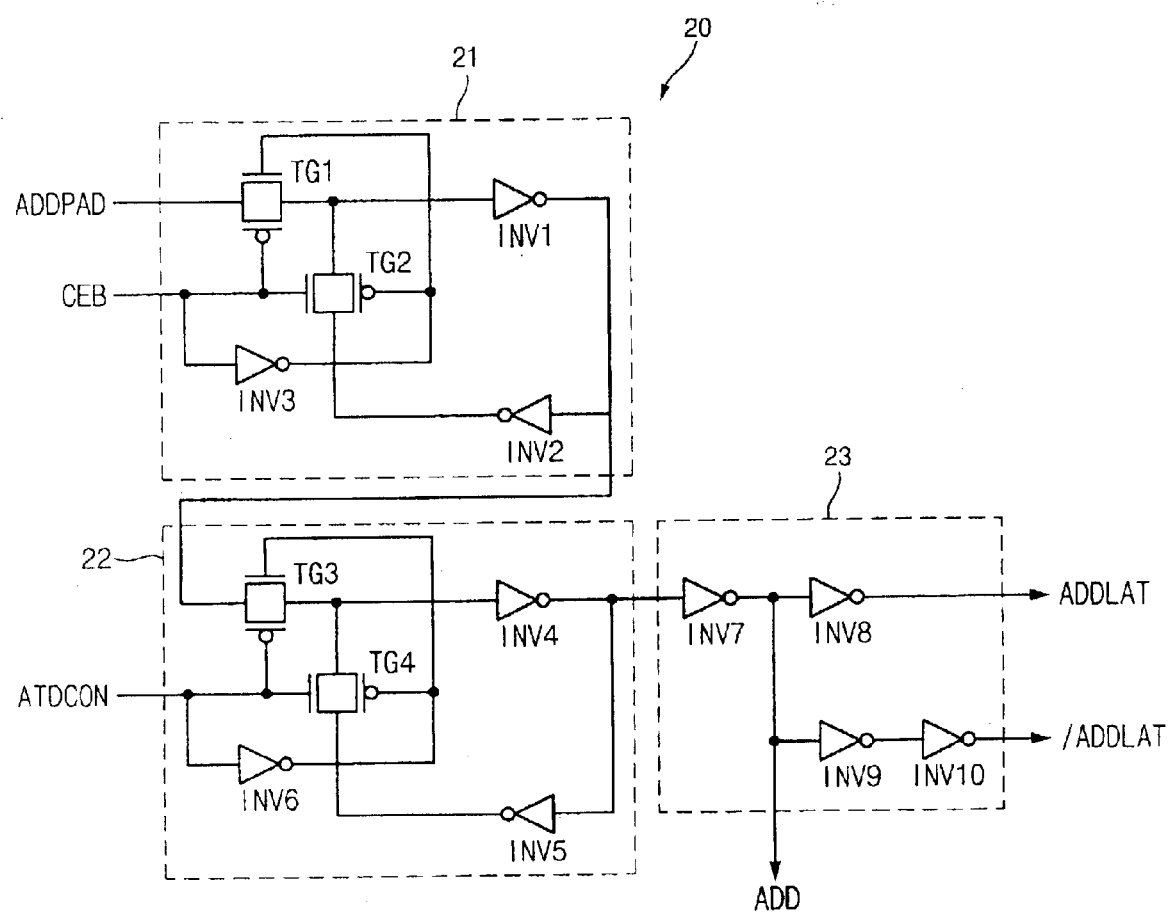
FIG. 13 is a detail circuit diagram illustrating an address latch in the nonvolatile ferroelectric memory device of FIG. 5.

FIG. 13 is a detail circuit diagram illustrating an address latch in the nonvolatile ferroelectric memory device of FIG. 5.

The address latch 20 comprises a selective latch unit 21, a selective latch unit 22 and a buffer unit 23. The selective latch unit 21 selectively latches the address signal ADDPAD inputted via an address pad in response to the chip enable signal CEB. The selective latch unit 22 selectively latches a signal outputted from the selective latch unit 21 in response to an address control signal ATDCON. The buffer unit 23 buffers a signal outputted from the selective latch unit 22 and the outputs the address ADD.

The selective latch unit 21 comprises a transmission gate TG1, inverters INV1 and INV2 and a transmission gate TG2. The transmission gate TG1 controlled by the chip enable signal CEB and a signal inverted by an inverter INV3 selectively transmits the address signal ADDPAD inputted via the address pad. The inverters INV1 and INV2 inverts and latches a signal selectively transmitted from the transmission gate TG1. The transmission gate TG2 controlled by the chip enable signal CEB and a signal inverted by the inverter INV3 selectively transmits a signal outputted from the inverter INV2 into an input terminal of the inverter INV1.

The selective latch unit 22 comprises a transmission gate TG3, inverters INV4 and INV5 and a transmission gate TG4. The transmission gate TG3 controlled by the address transition control signal ATDCON and a signal inverted by an inverter INV6 selectively transmits a signal outputted from the selective latch unit 21. The inverters INV4 and INV5 inverts and latches a signal selectively transmitted from the transmission gate TG3. The transmission gate TG4 controlled by the address transition control signal ATDCON and a signal inverted by the inverter INV6 selectively transmits a signal outputted from the inverter INV5 into an input terminal of the inverter INV4.

The buffer unit 23 comprises inverters INV7, INV8, INV9 and INV10. The inverter INV7 inverts a signal outputted from the selective latch unit 22 and then outputs an address ADD. The inverter INV8 inverts a signal outputted from the inverter INV7 and then outputs an address latch signal ADDLAT. The inverters INV9 and INV10 sequentially invert signals outputted from the inverter INV7 and the output inverted address latch signals/ADDLAT.

Here, if the address transition control signal ATDCON is at a high level, the memory cell is being operated. If the address transition control signal ATDCON is at a low level, the memory cell is receiving the next address.

Additionally, the state of the address transition control signal ATDCON is determined by activation of the memory cell operation.

Figure 14A:
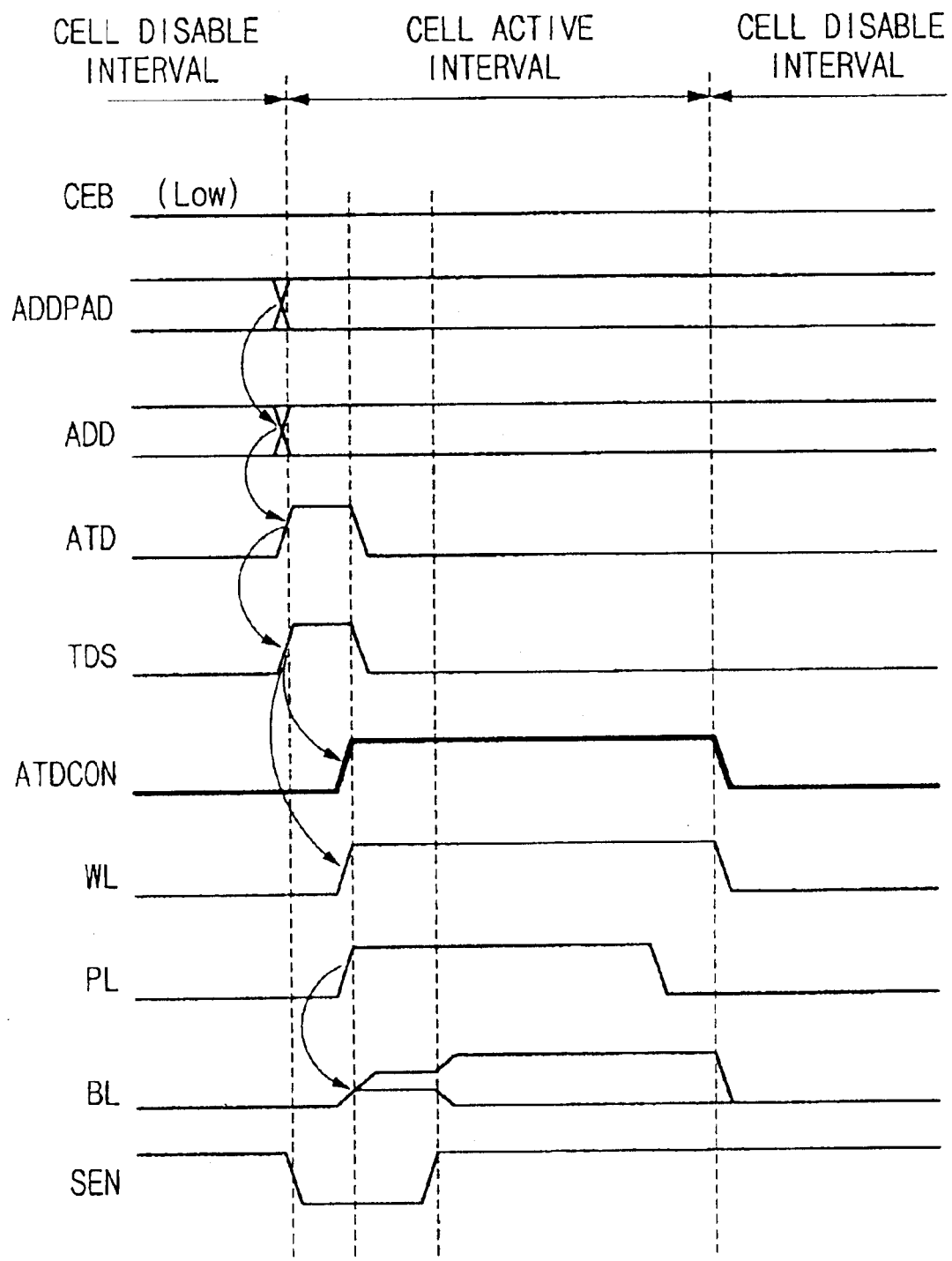
FIGS. 14a and 14b are timing diagrams illustrating the operations of the address latch in the nonvolatile ferroelectric memory device of FIG. 5.

FIG. 14a is a timing diagram illustrating the address transition control signal ATDCON of FIG. 13 when the chip enable signal CEB is held at a low level.

The address transition control signal ATDCON transits to a high level at a point where the memory cell begins to operate, and then automatically transits to a low level at a point where the memory cell finishes operating.

Figure 14B:
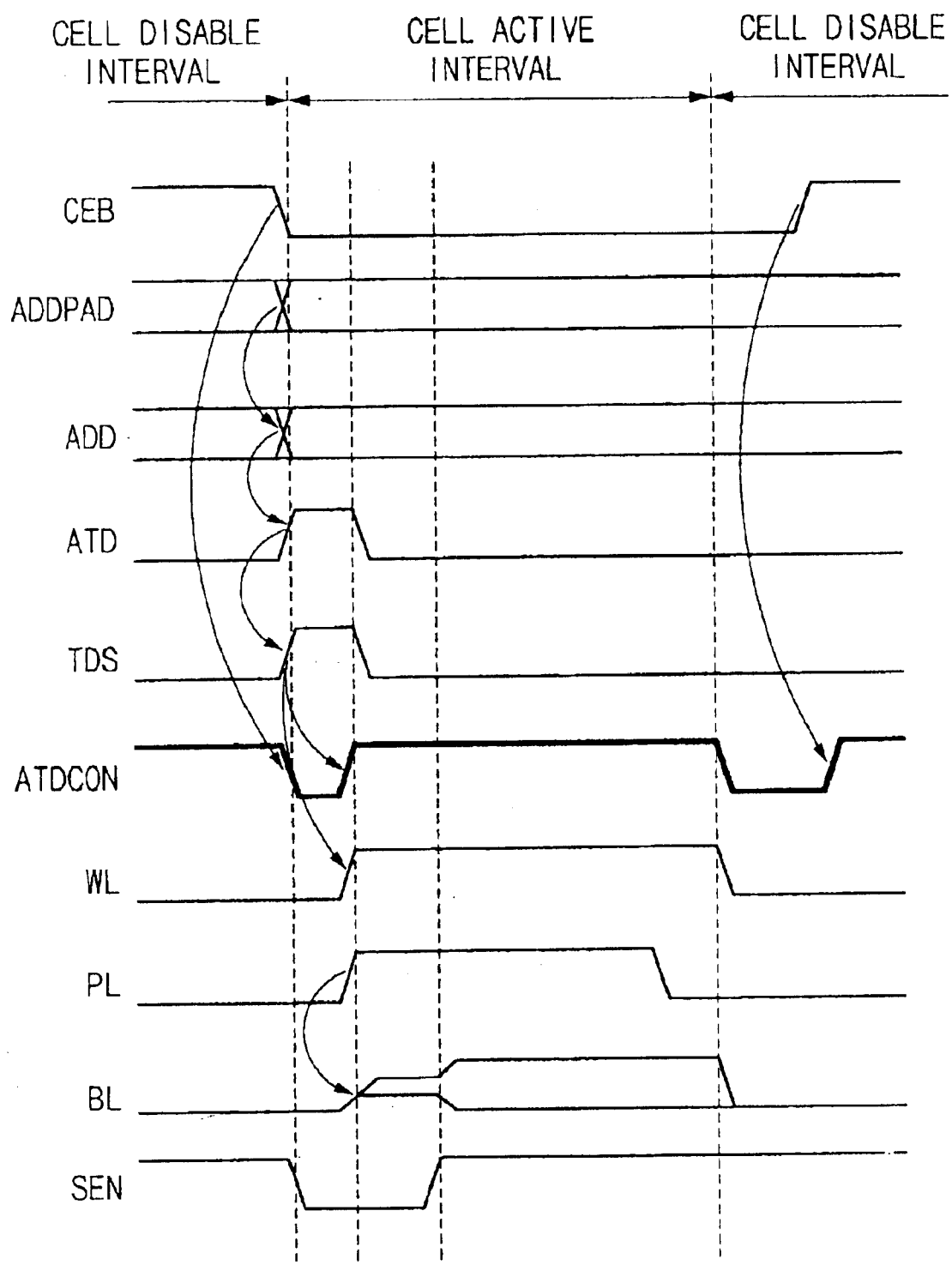

FIG. 14b is a timing diagram illustrating the address transition control signal ATDCON of FIG. 13 when the level of the chip enable signal CEB is transited.

Because the address transition control signal ATDCON is at a high level in an interval where the chip enable signal CEB is at a high level, the next address is not inputted in the selective latch unit 22 during the interval where the chip enable signal CEB is at a high level.

Thereafter, if the chip enable signal CEB becomes at a low level, the address control signal ATDCON becomes at a low level and receives an address latched by the selective latch unit 21. As a result, because the address control signal ATDCON becomes at a high level in an interval where the memory cell is activated and the chip enable signal CEB is at a high level, the next address is not inputted in the selective latch unit 22.

Figure 15:
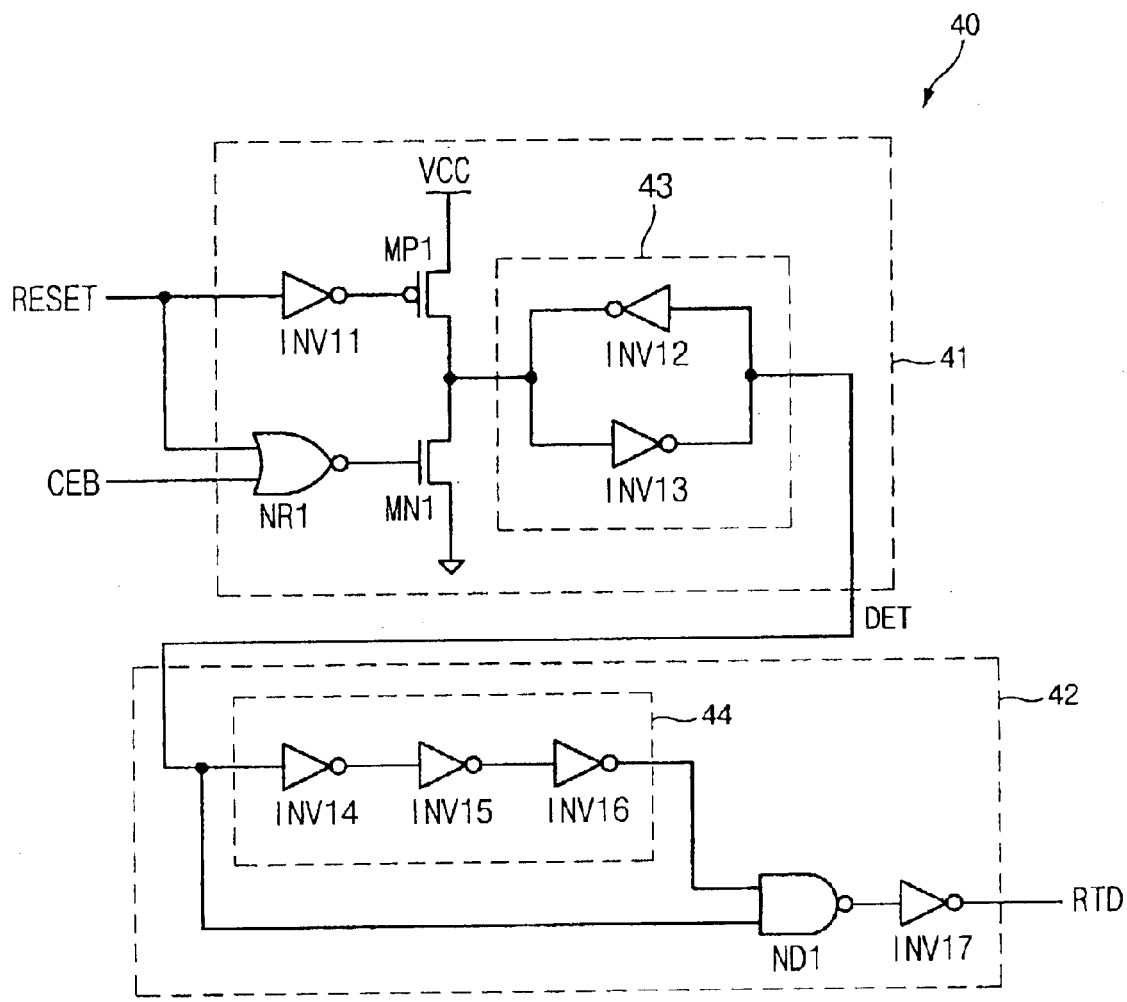
FIG. 15 is a detail circuit diagram illustrating a reset signal transition detecting unit in the nonvolatile ferroelectric memory device of FIG. 5.

FIG. 15 is a detail circuit diagram illustrating a reset signal transition detecting unit in the nonvolatile ferroelectric memory device of FIG. 5.

The reset signal transition detector 40 comprises a detector 41 and a pulse generator 42. The detector 41 detects an activation point of the initial reset signal RESET and the chip enable signal CEB by using the reset signal RESET and the chip enable signal CEB. The pulse generator 42 outputs a reset signal transition detecting signal RTD in response to a signal DET outputted from the detector 41.

The detector 41 comprises a NOR gate NR1, an inverter INV11, a PMOS transistor MP1, a NMOS transistor MN1 and a latch unit 43. The NOR gate NR1 NORs the reset signal RESET and the chip enable signal CEB. The inverter INV11 inverts the reset signal RESET. The PMOS transistor MP1 and the NMOS transistor MN1 connected in series between a power voltage VCC and a ground voltage VSS have gates to receive signals outputted from the inverter INV11 and the NOR gate NR1, respectively. The latch unit 43 comprising inverters INV 12 and INV13 inverts and latches a potential of the common drain of the PMOS transistor MP1 and the NMOS transistor MN1.

The pulse generator 42 comprises an inverting delay unit 44, a NAND gate ND1 and an inverter INV17. The inverting delay unit 44 comprising inverters INV14, INV15 and INV16 delays the signal DET outputted from the detector 41 for a predetermined period. The NAND gate ND1 NANDs the signal DET outputted from the detector 41 and a signal outputted from the inverting delay unit 44. The inverter INV17 inverts a signal outputted from the NAND gate ND1 and the outputs the reset signal transition detecting signal RTD.

Figure 16A:
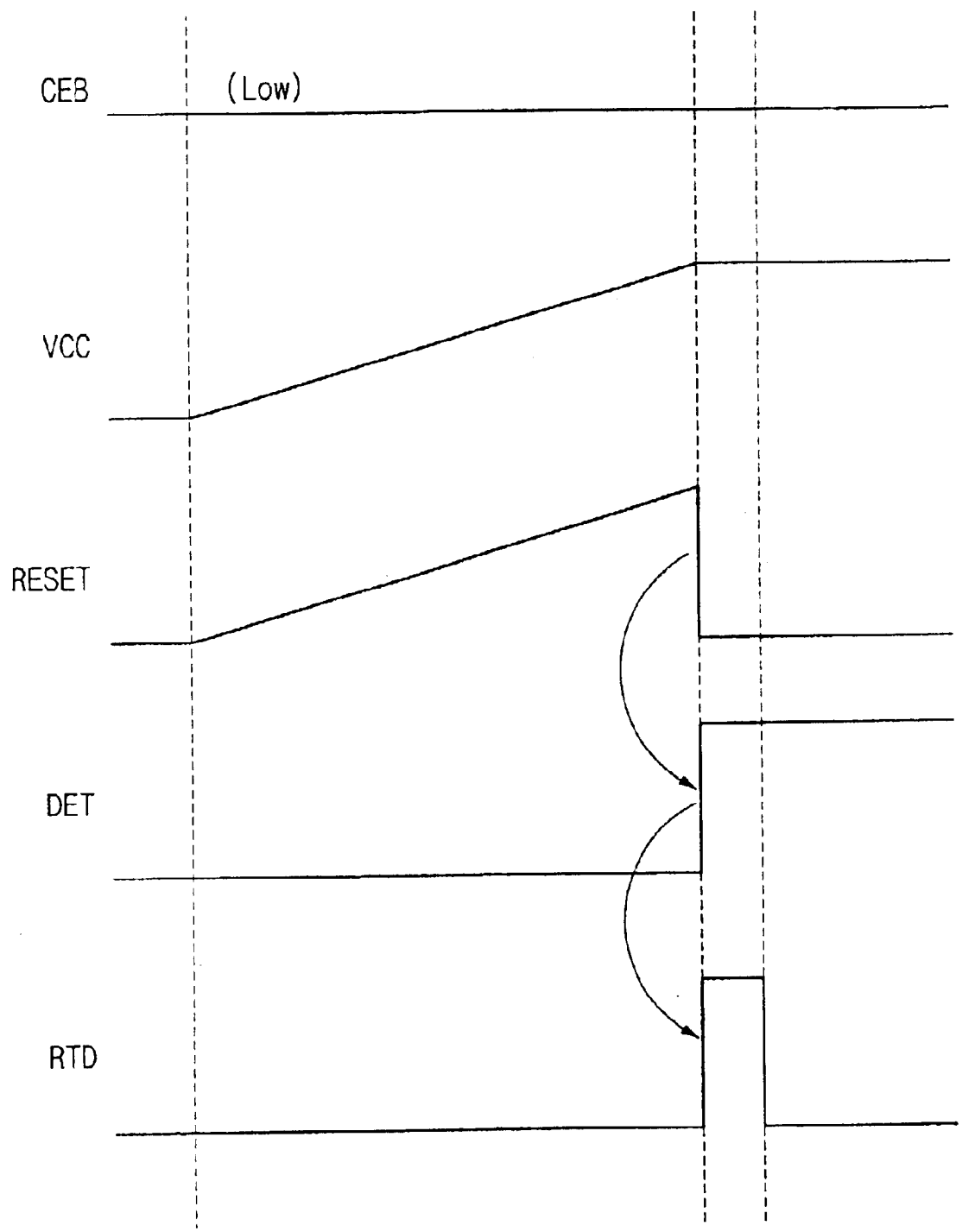
FIG. 16a is a timing diagram illustrating the operation of the reset signal transition detecting unit of FIG. 15 when a chip enable signal is held at a low level.

FIG. 16a is a timing diagram illustrating the operation of the reset signal transition detecting unit of FIG. 15 when a chip enable signal is held at a low level.

While the chip enable signal CEB is held at a low level, the levels of the reset signal RESET and the power voltage VCC rise by equal amount in an initial state where the power voltage VCC is below a predetermined level.

Here, when the signal outputted from the NOR gate NR1 becomes at a low level, the NMOS transistor MN1 is turned off. And, when the signal outputted from the inverter INV11 becomes at a low level, the PMOS transistor MP1 is turned on.

As a result, the signal DET outputted from the latch unit 32 is held at a low level.

Subsequently, if the level of the power voltage VCC rises to a predetermined voltage, the reset signal RESET transits to a low level.

As a result, the PMOS transistor MP1 is turned off and the NMOS transistor MN1 is turned on. Then, the signal DET outputted from the latch unit 43 transits to a high level.

Next, the pulse generator 42 generates a pulse of the reset signal transition detecting signal RTD at a point where the signal DET outputted from the latch unit 43 transits to a high level.

Because the PMOS transistor MP1 of the detector 41 is turned off while the reset signal RESET is held at a low level, the signal latched by the latch unit 43 is not changed although the chip enable signal CEB transits to a high level and the NMOS transistor MN1 is turned off.

Figure 16B:
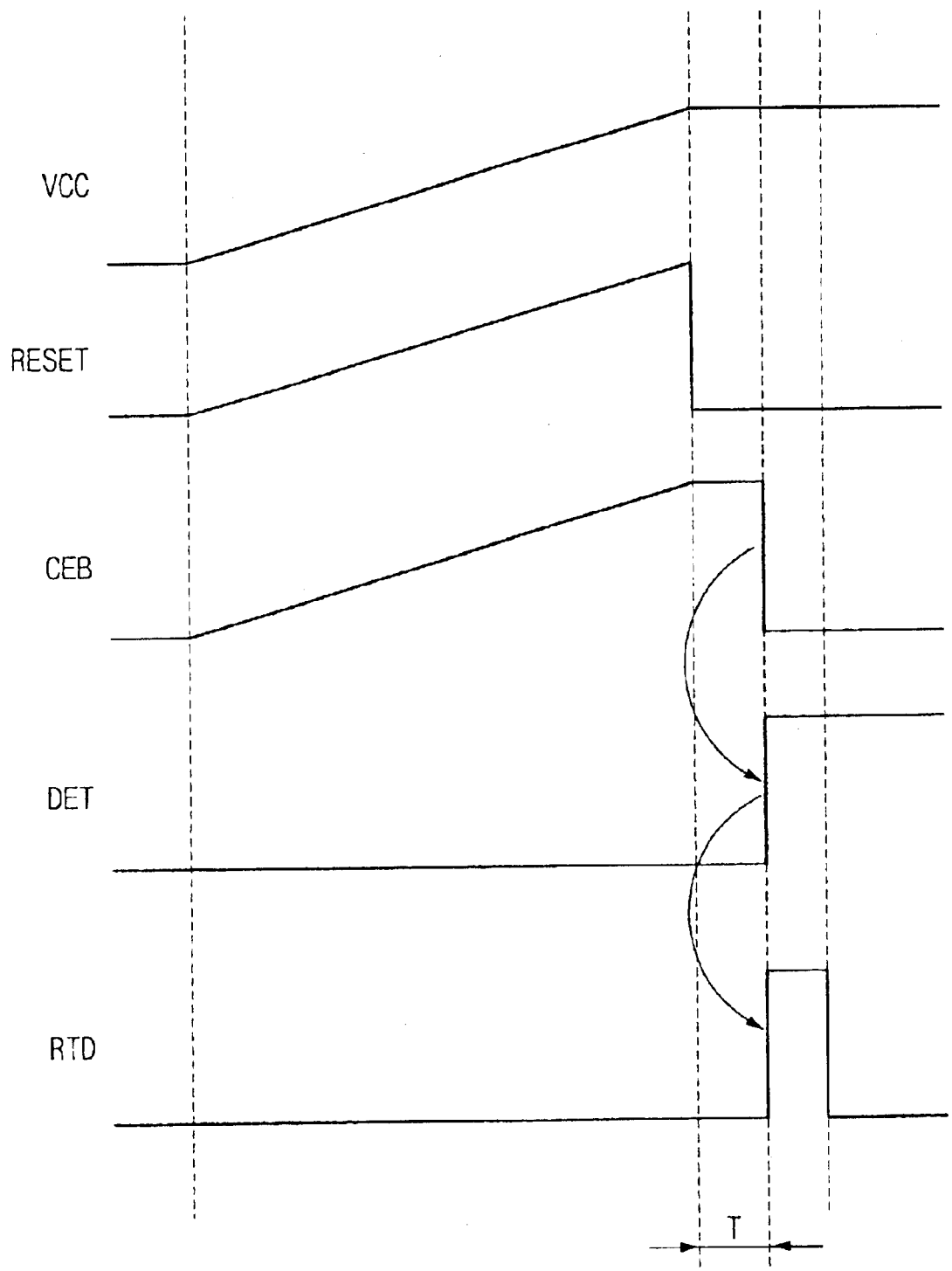
FIG. 16b is a timing diagram illustrating the operation of the reset signal transition detecting unit of FIG. 15 when a chip enable signal transits to a low level after a reset signal transits to a low level.

FIG. 16b is a timing diagram illustrating the operation of the reset signal transition detecting unit of FIG. 15 when a chip enable signal transits to a low level after a reset signal transits to a low level.

If the reset signal RESET transits to a low level and the chip enable signal CEB is held at a high level for a predetermined period T, the signal DET outputted from the detector 41 is held at a low level, which is its initial state.

Here, if the chip enable signal CEB transits to a low level, the signal outputted from the NOR gate NR1 becomes at a high level. Then, the NMOS transistor MN1 is turned on and the signal DET outputted from the detector 41 transits to a high level.

As a result, the pulse generator 42 generates a pulse of the reset signal transition detecting signal RTD at a point where the signal DET outputted from the detector 41 transits to a high level.

Figure 17:
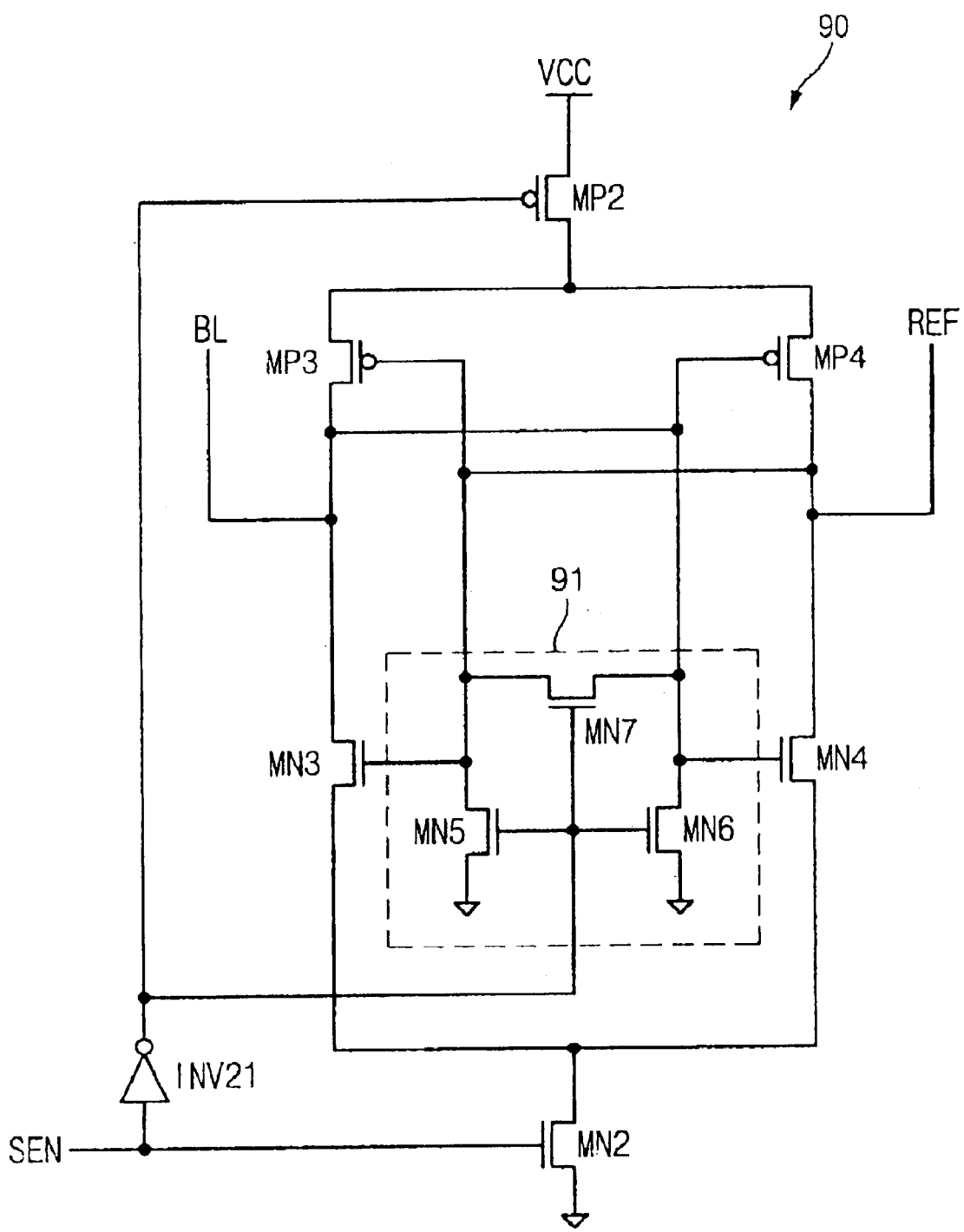
FIG. 17 is a detail circuit diagram illustrating a sense amplifier in the nonvolatile ferroelectric memory device of FIG. 5.

FIG. 17 is a detail circuit diagram illustrating the sense amplifier in the nonvolatile ferroelectric memory device of FIG. 5. Here, a sense amplifier of a latch type is described for example.

The sense amplifier 90 comprises a NMOS transistor MN2 and a PMOS transistor MP2, PMOS transistors MP3 and MP4 and NMOS transistors MN3 and MN4, and an equalizing unit 91. The NMOS transistor MN2 and the PMOS transistor MP2 have gates to receive a sense amplifier enable signal SEN and a signal inverted by an inverter INV21, respectively. The PMOS transistors MP3 and MP4 and the NMOS transistors MN3 and MN4 connected between drains of the PMOS transistor MP2 and the NMOS transistor MN2 have cross-coupled gates. The PMOS transistors MP3 and MP4 and the NMOS transistors MN3 and MN4 compare data carried in a bitline BL with a potential carried in a reference line REF, and then sense and amplify the data. The equalizing unit 91 controlled by the signal outputted from the inverter INV 21 equalizes the bitline BL and the reference line REF to the ground voltage VSS.

The equalizing unit 91 comprises NMOS transistors MN5, MN6 and MN7. The NMOS transistors MN5 and MN6 controlled by the signal outputted from the inverter 21, respectively, pull down the bitline BL and the reference line REF to the ground voltage VSS. The NMOS transistor MN7 connected between the bitline BL and the reference line REF and controlled by the signal outputted from the inverter INV21 equalizes the bitline BL and the reference line REF.

If the sense amplifier enable signal SEN becomes at a high level, the equalizing unit 91 is deactivated and the sense amplifier 90 is activated. As a result, the sense amplifier 90 compares data in the bitline BL with a potential in the reference line REF, and then senses and amplifies the data.

On the contrary, if the sense amplifier enable signal SEN becomes at a low level, the sense amplifier 90 is deactivated and the NMOS transistors MN5, MN6 and MN7 of the equalizing unit 91 are all turned on. As a result, the NMOS transistors MN5, MN6 and MN7 equalize the bitline and the reference line REF to the ground voltage VSS.

Figure 18:
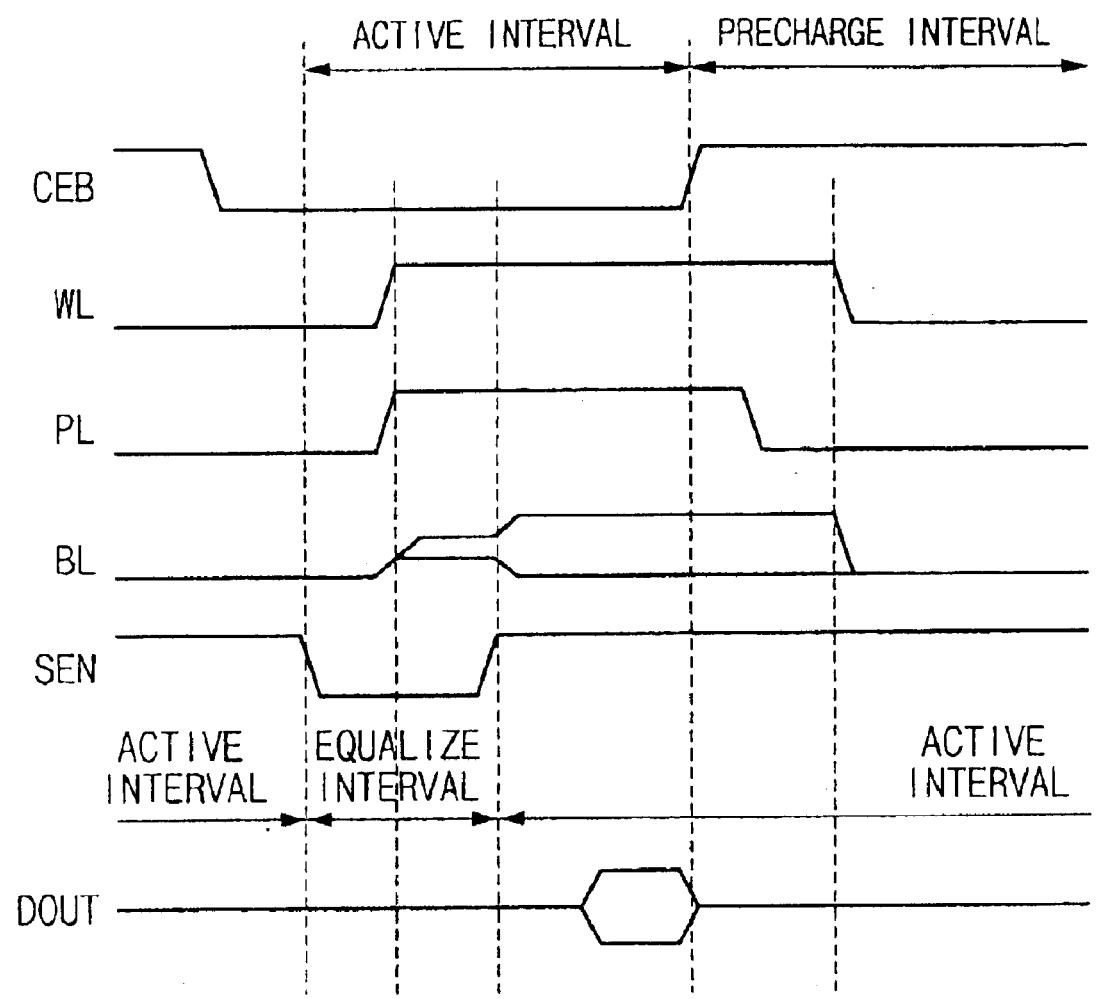
FIG. 18 is a timing diagram illustrating the operation of the sense amplifier in the nonvolatile ferroelectric memory device of FIG. 17.

FIG. 18 is a timing diagram illustrating the operation of the sense amplifier in the nonvolatile ferroelectric memory device of FIG. 17.

The state of the sense amplifier enable signal SEN is determined by a transition detecting signal TDS regardless of transition point of the chip enable signal CEB. The transition detecting signal TDS synthesized with the address transition detecting signal ATD, the reset signal transition detecting signal RTD and the write enable signal transition detecting signal WTD by the synthesizer 60.

The sense amplifier 90 is initialized by the equalizing unit 91 only in a pulse interval of the synthesized transition detecting signal TDS. In the rest intervals, because the chip enable signal CEB is held at an active state in a precharge interval where the chip enable signal CEB is at a high level, data latched in the previous memory cell operation may be operated by using the chip enable signal CEB and the output enable signal OEB at any time.

Figure 19:
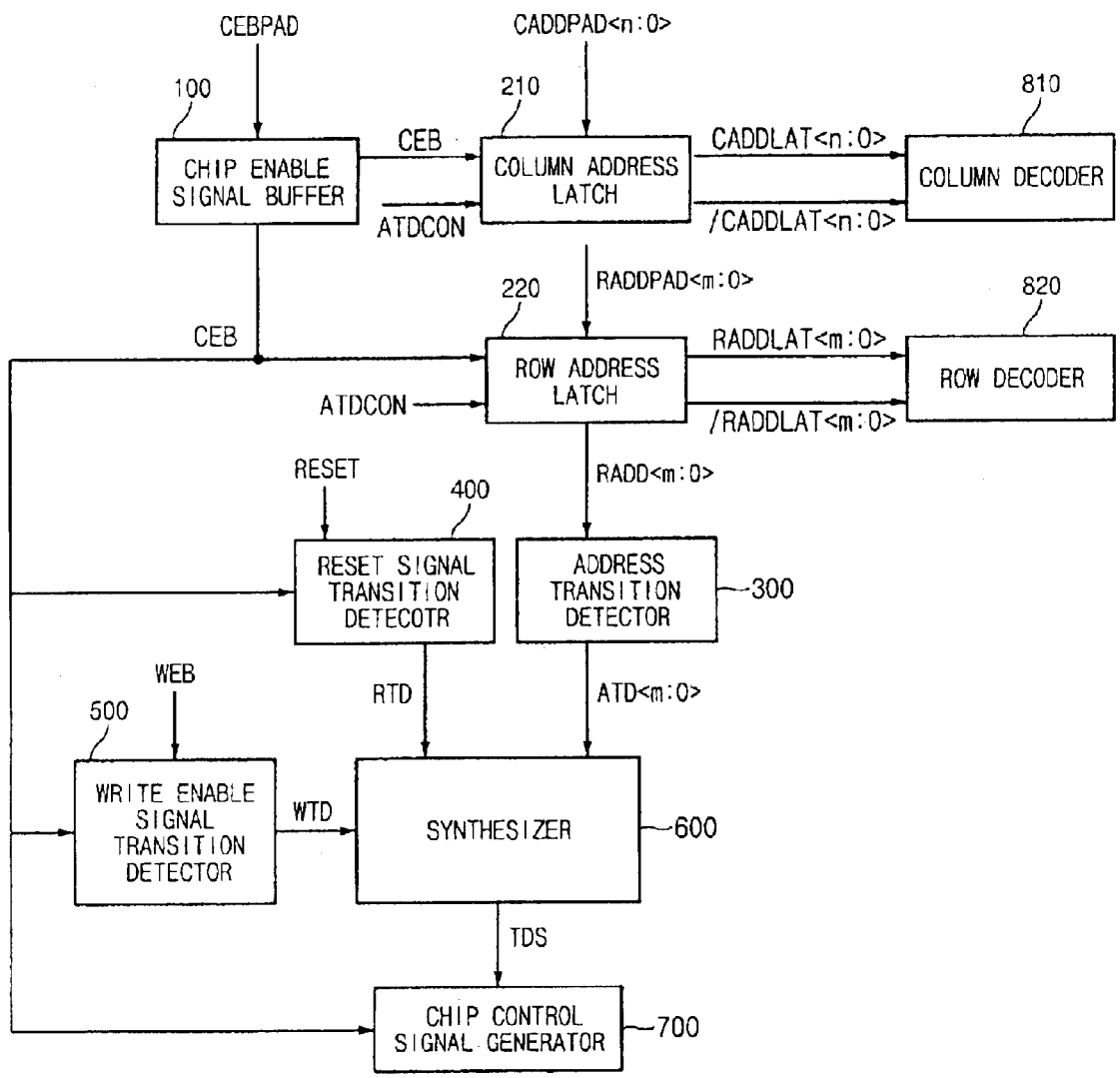
FIG. 19 is a block diagram illustrating a chip control signal generating circuit in the nonvolatile ferroelectric memory device in accordance with another preferred embodiment of the present invention.

FIG. 19 is a block diagram illustrating a chip control signal generating circuit for generating a chip control signal in the nonvolatile ferroelectric memory device in accordance with another preferred embodiment of the present invention. Here, the circuit is configured to generate an address transition detecting signal ATD only at a transition point of row address RADD.

A chip enable signal buffer 100 receives a signal CEB-PAD inputted in a chip enable pad. A column address latch 210 latches a column address CADDPAD inputted in a column address pad.

A column decoder 810 outputs a column selecting signal by using a column address CADDLAT outputted from the column address latch 210.

A row address latch 220 latches a row address RADDPAD inputted in a row address pad.

An address transition detector 300 detects a transition point of row address RADD outputted from the row address latch 220, and then outputs an address transition detecting signal ATD.

A reset signal transition detector 400 detects a point where a reset signal RESET and a chip enable signal CEB outputted from the chip enable buffer 100 are all at a low level, and outputs a reset signal transition detecting signal RTD.

A write enable signal transition detector 500 detects a transition point of write enable signal WEB, and outputs a write enable signal transition detecting signal WTD.

A synthesizer 600 synthesizes a reset signal transition detecting signal RTD, a write enable signal transition detecting signal WTD and an address transition detecting signal ATD, and then outputs a synthesized transition detecting signal TDS.

A chip control signal generator 700 outputs chip control signals by using the transition detecting signal TDS.

Here, a row decoder 820 decodes a row address RADDLAT outputted from the row address latch 220, and then drives a corresponding wordline.

Figure 20:
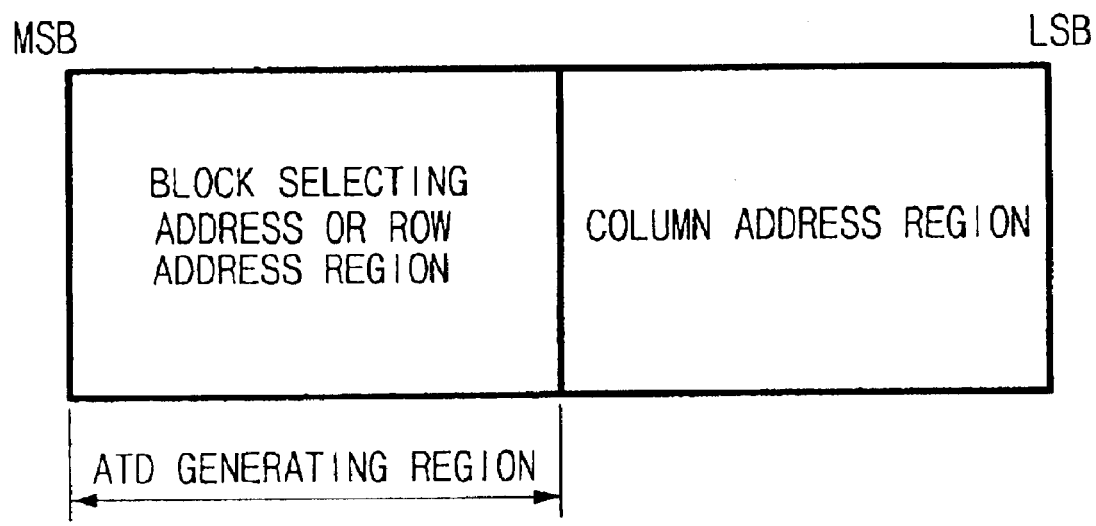
FIG. 20 is a conceptual diagram illustrating address regions of the chip control signal generating circuit in the nonvolatile ferroelectric memory device in accordance with another preferred embodiment of the present invention.

FIG. 20 is a conceptual diagram illustrating address regions of the chip control signal generating circuit in the nonvolatile ferroelectric memory device in accordance with another preferred embodiment of the present invention.

When the memory device operates, it is probable that an address in less significant address region operates. As a result, block selecting address or row address RADD regions are allotted to more significant bit MSB regions while column address CADD regions are allotted to less significant bit LSB regions.

Accordingly, only when a block selecting address BS or a row address RADD are transited, an address transition detecting signal ATD is generate to operate the memory cell. When a column address CADD is transited, because the address transition detecting signal ATD is not generated, the memory cell is not operated, and data latched in the sense amplifier is immediately outputted.

As discussed earlier, in the disclosed nonvolatile ferroelectric memory device, cell operations are performed not by a chip enable signal but by a transition detecting signal synthesized with address transition detecting signal, reset signal transition detecting signal and write enable transition detecting signal. As a result, the frequency of cell operations are reduced, thereby improving reliability of the cell and reducing power consumption.

Additionally, the disclosed FRAM comprises an address latch instead of a conventional address buffer, and an equalizing unit controlled by a sense amplifier enable signal of a sense amplifier. As a result, data latched in the sense amplifier may be outputted in a precharge interval regardless of chip enable signal without performing the whole chip operation, thereby reducing power consumption.

When a column address is transited, an address transition detecting signal is not generated. The address transition detecting signal is generated at a transition point of row address. In this way, the cell can be operated by a local operation without performing the whole chip operation, thereby improving reliability of the cell and reducing power consumption.

Many changes and modifications to the embodiments described herein could be made. The scope of some changes is discussed above. The scope of others will become apparent from the appended claims.

What is claimed is:

1. A nonvolatile ferroelectric memory device comprising a cell array including a plurality of ferroelectric memory cells for storing data through a bitline and reading the stored data, selected by a wordline and a plateline, comprising:

an address latch for receiving an inputted address through an address pad to select the wordline and the bitline before the cell operation, and for latching the address during the cell operation;

a reset signal transition detecting means for detecting a start point where a reset operation and a cell operation are both performed, and for outputting a reset signal transition detecting signal;

a write enable signal transition detecting means for detecting a point where a write operation starts and for outputting a write enable signal transition detecting signal;

a synthesizing means for synthesizing an address transition detecting signal detecting a transition point of an address selectively latched by the address latch, the reset signal transition detecting signal and the write enable signal transition detecting signal, and for outputting a transition synthesizing signal; and a chip control signal generating means for generating chip control signals in response to the transition synthesizing signal.

2. The device according to claim 1, further comprising a buffer means for temporarily storing a chip enable signal inputted through an external control signal pad.

3. The device according to claim 1, wherein the address latch comprises:

a first latch means for receiving the address during the cell operation and for latching the address inputted during the interval where the cell does not operate;

a second latch means for receiving an address latched by the first latch means during the interval where the cell does not operate and for latching an address latched by the first latch means inputted during the cell operation; and a buffer means for driving an address latched by the second latch means.

4. The device according to claim 3, wherein the first latch means comprises a first transmitting means for selectively transmitting an address inputted through the address pad.

5. The device according to claim 3, wherein the second latch means comprises a second transmitting means for selectively transmitting an address latched by the first latch means, controlled by an address transition control signal held at a high level during an interval where the chip enable signal is at a high level.

6. The device according to claim 1, wherein the reset signal transition detecting means comprises:

a detecting means for detecting a point where both a reset signal and a chip enable signal become at a low level; and a pulse generating means for generating a pulse at a point where a signal outputted from the detecting means transits.

7. The device according to claim 6, wherein the detecting means comprises:

an inverting means for inverting the reset signal;

a logic gate for logically combining the reset signal and the chip enable signal;

a pull-up means for pulling up an output terminal in response to a signal outputted from the inverting means; and a pull-down means for pulling down the output terminal in response to a signal outputted from the logic gate.

8. The device according to claim 7, wherein the detecting means comprises a latch means for latching a electric potential of the output terminal.

9. The device according to claim 1, further comprising a sense amplifier for sensing and amplifying data stored in response to a sense amplifier enable signal of the chip control signals and then outputting the data, wherein the sense amplifier comprises an equalizing means for equalizing an input/output terminal into equal potential, controlled by the sense amplifier enable signal.

10. The device according to claim 1, wherein the address transition detecting signal is a signal detecting a transition point of row address among addresses outputted from the address latch means.

11. The device according to claim 10, wherein the address comprises a row address arranged in a more significant region and a column address arranged in a less significant region.

12. The device according to claim 1, wherein the address transition detecting signal is to detect a transition point of a block selection address among addresses outputted from the address latch means.

13. The device according to claim 12, wherein the address comprises a block selection address arranged in a more significant region and a column address arranged in a less significant region.

14. The device according to claim 1, wherein the address latch receives an address inputted through the address pad during the cell operation and then latches the received address during an interval where the cell does not operate, receives the latched address during the cell operation and the chip operation, and then latches an address received during an interval where the cell does not operate.

15. The device according to claim 1, wherein the reset signal transition detecting means outputs the reset signal transition detecting signal having a pulse type at a point where a reset operation starts in the cell operation.

16. The device according to claim 1, wherein the reset signal transition detecting means outputs the reset signal transition detecting signal having a pulse type at a point where the chip operation starts after the reset operation.

17. The device according to claim 1, wherein the reset signal transition detecting signal is not generated during a chip operation once a reset operation has been performed.

18. The device according to claim 1, wherein the synthesizing means generates the transition synthesizing signal including pulses of the address transition detecting signal, a pulse of the reset signal transition detecting signal and a pulse of the write enable signal transition detecting signal.

* * * * *